US012446167B2

(12) United States Patent
Yanagida et al.

(10) Patent No.: US 12,446,167 B2
(45) Date of Patent: Oct. 14, 2025

(54) CIRCUIT ASSEMBLY

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(72) Inventors: Taiji Yanagida, Osaka (JP); Hiroki Shimoda, Osaka (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 243 days.

(21) Appl. No.: 18/265,581

(22) PCT Filed: Dec. 14, 2021

(86) PCT No.: PCT/JP2021/045973
§ 371 (c)(1),
(2) Date: Jun. 6, 2023

(87) PCT Pub. No.: WO2022/138314
PCT Pub. Date: Jun. 30, 2022

(65) Prior Publication Data
US 2024/0032210 A1    Jan. 25, 2024

(30) Foreign Application Priority Data
Dec. 23, 2020   (JP) ................. 2020-213262

(51) Int. Cl.
*H05K 5/00*   (2025.01)
*H05K 1/02*   (2006.01)
(Continued)

(52) U.S. Cl.
CPC ......... *H05K 5/0069* (2013.01); *H05K 1/0212* (2013.01); *H05K 1/05* (2013.01);
(Continued)

(58) Field of Classification Search
CPC . H05K 5/0069; H05K 5/03; H05K 2201/0206
(Continued)

(56) References Cited

U.S. PATENT DOCUMENTS

2003/0168432 A1* 9/2003 Onizuka ............. H05K 7/026
                                                           218/7
2015/0340325 A1   11/2015 Saito et al.
(Continued)

FOREIGN PATENT DOCUMENTS

JP   2002-176279   6/2002
JP   2002-246775   8/2002
(Continued)

OTHER PUBLICATIONS

International Search Report issued in WIPO Patent Application No. PCT/JP2021/045973, dated Mar. 8, 2022, along with an English translation thereof.

*Primary Examiner* — Hung S. Bui
(74) *Attorney, Agent, or Firm* — Greenblum & Bernstein, P.L.C.

(57) ABSTRACT

Disclosed is a circuit assembly having a novel structure capable of reducing thermal resistance in a heat-dissipating path and increasing heat dissipation while ensuring insulation between a heat-dissipating portion and a heat-dissipation target. A circuit assembly includes: heat-generating components that generate heat as a result of a current flowing therethrough; a case accommodating the heat-generating components; metal plates connected to connecting portions of the heat-generating components, and each having a heat-dissipating portion exposed to an outside of the (Continued)

case and configured to come into thermal contact with an external heat-dissipation target; insulating films covering a contact surface of the heat-dissipating portion, the contact surface being configured to come into contact with the heat-dissipation target; and a thermal conductive filling member that is in thermal contact with the heat-dissipating portion via the insulating films and disposed between the insulating films and the heat-dissipation target.

11 Claims, 8 Drawing Sheets

(51) Int. Cl.
    *H05K 1/05*            (2006.01)
    *H05K 5/03*            (2006.01)
(52) U.S. Cl.
    CPC ....... *H05K 5/03* (2013.01); *H05K 2201/0206* (2013.01); *H05K 2201/06* (2013.01)

(58) Field of Classification Search
    USPC .......................... 361/752, 728, 730, 796, 800
    See application file for complete search history.

(56) References Cited

U.S. PATENT DOCUMENTS

| | | | | |
|---|---|---|---|---|
| 2019/0289741 | A1* | 9/2019 | Ichikawa | ................. H02G 3/08 |
| 2019/0318892 | A1* | 10/2019 | Ikejiri | ............... H01M 10/6553 |
| 2024/0057294 | A1* | 2/2024 | Yanagida | ................. H02G 3/16 |

FOREIGN PATENT DOCUMENTS

| | | | | |
|---|---|---|---|---|
| JP | 2006-191732 | | 7/2006 | |
| JP | 2006187119 A | * | 7/2006 | .............. H05K 7/06 |
| JP | 2006-271132 | | 10/2006 | |
| JP | 2012-165567 | | 8/2012 | |
| WO | 2014/064806 | | 5/2014 | |

* cited by examiner

CIRCUIT ASSEMBLY

TECHNICAL FIELD

The present disclosure relates to a circuit assembly having a heat-generating component.

BACKGROUND ART

Conventionally, circuit assemblies equipped with heat-generating components that generate heat when a current flows therethrough, such as relays and fuses, may have a heat-dissipating structure for dissipating the heat of the heat-generating components. For example, Patent Document 1 discloses a structure in which a bus bar connected to a relay accommodated in a case is integrated with a heat sink via an insulating thermal conductive sheet, and an end portion of the heat sink is joined to the container case. This enables heat generated by the relay to be transferred to the bus bar, the thermal conductive sheet, the heat sink, and the container case in this order, and dissipate from the container case to the outside.

CITATION LIST

Patent Documents

Patent Document 1: JP 2002-176279A

SUMMARY OF INVENTION

Technical Problem

This type of conventional structure includes a large number of components in a heat-dissipating path, resulting in higher thermal resistance. This makes it unable to achieve a sufficient heat-dissipating effect, particularly with recent large-current devices and the like.

Disclosed is a circuit assembly having a novel structure capable of reducing thermal resistance in a heat-dissipating path and improving heat dissipation while ensuring insulation between a heat-dissipating portion and a heat-dissipation target.

Solution to Problem

A circuit assembly of the present disclosure includes: at least one heat-generating component that generates heat as a result of a current flowing therethrough; a case accommodating the at least one heat-generating component; at least one metal plate connected to a connecting portion of the at least one heat-generating component, and having a heat-dissipating portion exposed to an outside of the case and configured to come into thermal contact with an external heat-dissipation target; an insulating film covering a contact surface of the heat-dissipating portion, the contact surface being configured to come into contact with the heat-dissipation target; and a thermal conductive filling member that is in thermal contact with the heat-dissipating portion via the insulating film and disposed between the insulating film and the heat-dissipation target.

Advantageous Effects of Invention

According to the circuit assembly of the present disclosure, it is possible to reduce thermal resistance in a heat-dissipating path and improve heat dissipation while ensuring insulation between a heat-dissipating portion and a heat-dissipation target.

MODES FOR CARRYING OUT THE INVENTION

Description of Embodiments of Present Disclosure

Figure 1:
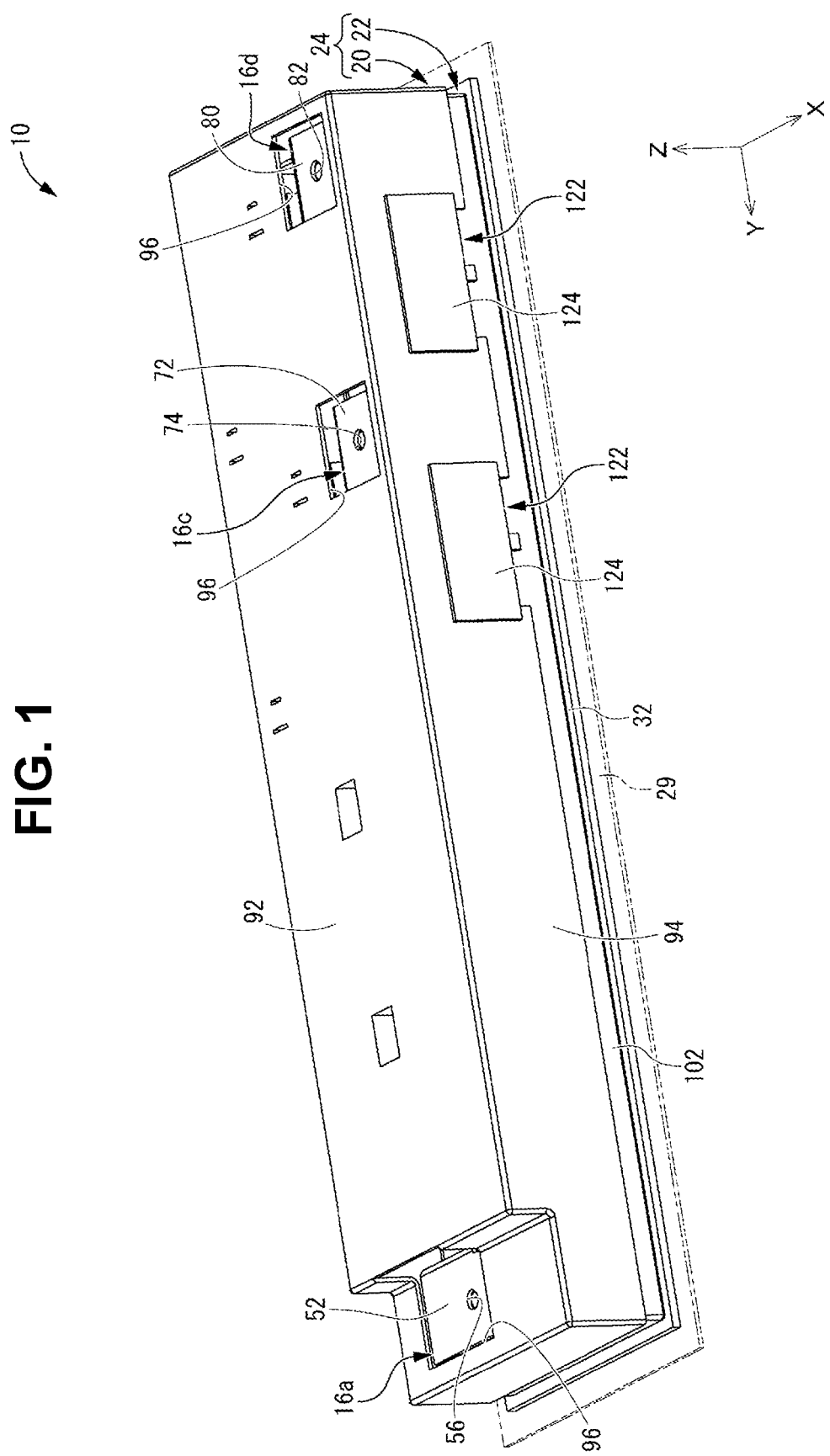
FIG. 1 is a perspective view of a circuit assembly according to Embodiment 1.

Firstly, embodiments of the present disclosure will be listed and described.

The circuit assembly of the present disclosure is (1) a circuit assembly including: at least one heat-generating component that generates heat as a result of a current flowing therethrough; a case accommodating the at least one heat-generating component; at least one metal plate connected to a connecting portion of the at least one heat-generating component, and having a heat-dissipating portion exposed to an outside of the case and configured to come into thermal contact with an external heat-dissipation target; an insulating film covering a contact surface of the heat-dissipating portion, the contact surface being configured to come into contact with the heat-dissipation target; and a thermal conductive filling member that is in thermal contact with the heat-dissipating portion via the insulating film and disposed between the insulating film and the heat-dissipation target.

According to the circuit assembly of the present disclosure, the heat-dissipating portion of the metal plate connected to the connecting portion of the heat-generating component is exposed to the outside of the case, and comes into contact with the external heat-dissipation target via the insulating film and the thermal conductive filling member. This can reduce the number of components present in a heat-dissipating path compared to conventional structures, and can reduce thermal resistance in the heat-dissipating path and improve heat dissipation. Moreover, insulation between the heat-dissipating portion and the heat-dissipation target is ensured using the insulating film. This makes it possible to sufficiently reduce the wall thickness of each member necessary for insulation and more advantageously reduce thermal resistance compared to conventional structures in which insulation for external components is ensured using a synthetic resin case. In addition, the thermal conductive filling member is arranged between the insulating film and the heat-dissipation target. Thus, even if a gap occurs between contact surfaces of the heat-dissipating portion and the heat-dissipation target due to a tolerance or the like, the thermal conductive filling member interposed therebetween can prevent deterioration of thermal conductivity caused by the gap and improve heat dissipation more advantageously. The application of the metal plate is not limited as long as the metal plate has the heat-dissipating portion. For example, the heat-dissipating portion may be provided in a current-carrying metal plate, or the heat-dissipating portion may be provided in a heat-dissipating metal plate separate from a current-carrying metal plate. Note that the heat-dissipating portion being exposed to the outside of the case refers to the state where the heat-dissipating portion is capable of coming into thermal contact with an external heat-dissipation target without via the case.

Note that the insulating film is not specifically limited and may be any type of insulating film as long as it has insulation properties and covers the contact surface of the heat-dissipating portion that comes into contact with the heat-dissipation target, but an insulating film made of polyethylene terephthalate (PET), polyethylene naphthalate (PEN), polytetrafluoroethylene (PTFE), polycarbonate (PC), polyimide (PI), or the like may be advantageously employed. The film thickness of the insulating film is not specifically limited, but preferably has a relatively thin film thickness in order to advantageously achieve thermal conductivity from the heat-dissipating portion to the heat-dissipation target. For example, an insulating film with a film thickness of 500 μm or less, more preferably 250 μm or less may be favorably employed.

The thermal conductive filling member may be of any type as long as it is a member that conducts heat from the heat-dissipating portion to the heat-dissipation target while absorbing looseness caused by tolerances or the like between the contact surfaces of the heat-dissipating portion and the heat-dissipation target. For example, a composite material obtained by filling a resin, such as epoxy resin or silicone resin, with a thermal conductive filler is employed as the thermal conductive filling member. For example, alumina (aluminum oxide), boron nitride, aluminum nitride, silicon nitride, or the like is used as the fillers to fill the resin. Note that the thermal conductive filling material may be in any of various forms, such as a sheet form, a gel form, and a grease form.

(2) It is preferable that a disposal region of the insulating film and a disposal region of the thermal conductive filling member are different.

The insulating film for ensuring insulation of the heat-dissipating portion for the heat-dissipation target and the thermal conductive filling member for absorbing looseness between the contact surfaces of the heat-dissipating portion and the heat-dissipation target are provided as separate members. This enables the insulating film and the thermal conductive filling member to be provided in a necessary area in which the functions that these members are required to have are achievable, and enables the effects of increasing the design flexibility and reducing the material cost compared to the case where a single member is to exhibit the insulation properties and the looseness absorbing function. Note that the "disposal region" refer to the areas where the insulating film and the thermal conductive filling member overlap the heat-dissipation target when the insulating film and the thermal conductive filling member are viewed in a direction in which these members are laid over the heat-dissipation target. "The disposal regions being different" includes the case where the area where the insulating film overlaps the heat-dissipation target and the area where the thermal conductive filling member overlaps the heat-dissipation target are different in size and/or shape, and the case where the positions of these areas are different from each other.

(3) It is preferable that the case has an opening portion that exposes the heat-dissipating portion to the outside, and the insulating film seals the opening portion.

The insulating film seals the opening portion provided in the case in order to expose the heat-dissipating portion of the metal plate to the outside. This leads to improvement of waterproofness of the case having the opening portion and prevention of short circuit or the like between the heat-dissipating portion and the heat-dissipation target caused by water entering the case, and can ensure insulation between the heat-dissipating portion and the heat-dissipation target more advantageously.

(4) It is preferable that the insulating film is fixed to the case, and the case has a plurality of protrusions disposed with gaps therebetween around a peripheral edge of the insulating film.

The insulating film that covers the placement surface of the heat-dissipating portion can be stably held by fixing the insulating film to the case, thus making the circuit assembly easier to handle. Further, the insulating film has a plurality of protrusions around the peripheral edge, and the plurality of protrusions makes it more difficult to access the peripheral edge of the insulating film from the outer peripheral side of the insulating film. This can inhibit a user from performing work of lifting the peripheral edge of the insulating film and peeling the insulating film, for example, and waterproofness inside the case is advantageously ensured in the case where the insulating film seals the opening portion of the case. Further, the plurality of protrusions being provided with gaps therebetween causes air or the like to be advantageously discharged from the gaps between the protrusions when the thermal conductive filling member is provided, thus resolving a malfunction in which air accumulates between the insulating film and the thermal conductive filling member and deteriorates heat dissipation.

Note that the gap through which the peripheral edge of the insulating film faces the protrusions has a size that inhibits fingers from entering. A known method, such as adhesion or welding, may be employed as a method for fixing the insulating film to the case.

(5) In the above configuration (4), it is preferable that the case includes an upper case and a lower case, and the plurality of protrusions each have a triangular shape in a projection in a direction in which the upper case and the lower case are fitted to each other, and are gradually tapered toward the insulating film located inward of the protrusions.

The plurality of protrusions, each of which has a triangular shape, are arranged in an orientation in which each protrusion is gradually tapered inward, and thus, the gaps between the protrusions gradually expand inward. This enables air between the insulating film and the filling member to be caught easily, and enables the air to be discharged more effectively. Further, each gap between the protrusions is smallest on the outer side, and thus exhibits the effect of inhibiting fingers from entering more effectively.

(6) It is preferable that the case includes an upper case and a lower case, the at least one heat-generating component is fixed to at least either the upper case or the lower case, the lower case has a placement surface to be placed on the heat-dissipation target, and the placement surface has an opening portion, the lower case has at least one positioning portion positioning the heat-dissipating portion of the at least one metal plate disposed in the opening portion such that the heat-dissipating portion is flush with the placement surface, the at least one metal plate has a connecting section connected to the connecting portion of the at least one heat-generating component, and the circuit assembly has at least one tolerance absorbing structure absorbing tolerances of the connecting section and the connecting portion at a connecting position when the heat-dissipating portion is positioned by the at least one positioning portion.

The lower case, which is fitted to the upper case, has the placement surface, i.e. a surface to be placed on the heat-dissipation target. The placement surface has the opening portion that exposes the heat-dissipating portion of the metal plate. The lower case having the positioning portion positioning the heat-dissipating portion and the placement surface such that the heat-dissipating portion and the placement surface are flush with each other suppresses or prevents a step from occurring between the heat-dissipating portion and the placement surface to cause a malfunction that may adversely affect the fixation of the insulating film. In addition, the connecting section of the metal plate with the heat-dissipating portion positioned on the lower case side needs to be connected to the connecting portion of the heat-generating component. Since the circuit assembly has the tolerance absorbing structure absorbing tolerances at the connecting position between the connecting section and the connecting portion, the connecting section of the metal plate with the heat-dissipating portion positioned by the lower case can be connected to the connecting portion of the heat-generating component without a problem. Note that the heat-generating component may be fixed to either the upper case or the lower case. However, if the heat-generating component is fixed to the upper case, displacements of the heat-generating component and the metal plate due to the tolerances thereof are more likely to increase at the position of the connection between the connecting portion of the heat-generating component and the connecting section of the metal plate when the upper case and the lower case are fitted to each other, and the tolerance absorbing effect is more effectively relished.

The shape of the positioning portion may be set in any manner as long as the positioning portion can position the lower face of the heat-dissipating portion such that the lower face is flush with the placement surface of the lower case. For example, a positioning portion may be favorably employed that makes the lower face of the heat-dissipating portion flush with the placement surface as a result of the upper face of the heat-dissipating portion coming into contact, partially or entirely, with the positioning portion.

(7) In the above configuration (6), it is preferable that the at least one heat-generating component includes a first heat-generating component, the at least one metal plate includes a first heat-generating component metal plate connected to the connecting portion of the first heat-generating component, and the connecting portion of the first heat-generating component and the connecting section of the first heat-generating component metal plate are fastened to each other using a first bolt extending in a direction orthogonal to a direction in which the upper case and the lower case are fitted to each other, a fastened section of the first heat-generating component metal plate has a bolt insertion hole having an elongated hole shape extending in the direction in which the upper case and the lower case are fitted to each other, and the bolt insertion hole constitutes a first tolerance absorbing structure that is included in the at least one tolerance absorbing structure.

The connecting portion of the first heat-generating component and the connecting section of the first heat-generating component metal plate are fastened by a bolt that extends in a direction orthogonal to the direction in which the upper case and the lower case are fitted to each other. The first tolerance absorbing structure can be provided as a simple structure in which the bolt insertion hole provided in the first heat-generating component metal plate is an elongated hole that extends in this fitting direction.

(8) In the above configuration (7), it is preferable that the upper case has a top wall and a side wall protruding from the top wall toward the lower case, the lower case has a bottom wall and a peripheral wall protruding from the bottom wall toward the upper case, and at least either the side wall or the peripheral wall has a work hole that allows the first bolt and a tool for fastening the first bolt to be inserted thereinto.

This is because the connecting section of the first heat-generating component metal plate with the heat-dissipating portion positioned relative to the positioning portion of the lower case can be bolted to the connecting portion of the first heat-generating component from the outside of the upper case, thereby realizing the positioning of the heat-dissipating portion and the lower case and the absorbing of the tolerances of the connecting portion and the connecting section with excellent workability.

(9) In the above configuration (7) or (8), it is preferable that the first heat-generating component metal plate is bent in an L shape, one end portion of the first heat-generating component metal plate serves as the heat-dissipating portion expanding parallel to the placement surface of the lower case, and another end portion of the first heat-generating component metal plate serves as the connecting section raised toward the upper case, and the placement surface of the lower case has an insertion hole having a slit shape that allows the connecting section to be inserted thereinto, and a recessed portion connected to the insertion hole, recessed toward the upper case, and accommodating the heat-dissipating portion, the opening portion includes the insertion hole and the recessed portion, a top plate of the recessed portion constitutes a first metal plate positioning portion positioning the first heat-generating component metal plate, and the first metal plate positioning portion is included in the at least one positioning portion.

Forming the first heat-generating component metal plate in an L-shape enables the connecting section of the first heat-generating component metal plate to be inserted into the case while reducing the opening area of the insertion hole provided in the placement surface of the lower case. Moreover, providing the recessed portion that is connected to the insertion hole and recessed toward the upper case enables the heat-dissipating portion to be accommodated in the recessed portion and makes the heat-dissipating portion flush with the placement surface.

Here, the top plate of the recessed portion can configure the first metal plate positioning portion that makes the heat-dissipating portion flush with the placement surface. This enables the heat-dissipating portion to be stably held by the lower case, and can advantageously ensure insulation between the heat-dissipating portion and circuits within the case.

(10) In any of the above configurations (6) to (9), it is preferable that the at least one heat-generating component includes a second heat-generating component, the at least one metal plate includes a second heat-generating component metal plate connected to the connecting portion of the second heat-generating component, the second heat-generating component metal plate has the heat-dissipating portion provided on one end side and expanding parallel to the placement surface of the lower case, the connecting section provided on another end side, located on the upper case side relative to the heat-dissipating portion, and expanding parallel to the heat-dissipating portion, and a joint portion raised from the heat-dissipating portion toward the connecting section, the placement surface of the lower case has an insertion hole that allows the connecting section and the joint portion to be inserted thereinto, and a recessed portion connected to the insertion hole, recessed toward the upper case, and accommodating the heat-dissipating portion, the opening portion includes the insertion hole and the recessed portion, a top plate of the recessed portion constitutes a second metal plate positioning portion positioning the second heat-generating component metal plate, and the second metal plate positioning portion is included in the at least one positioning portion, and the connecting section is fastened to the connecting portion of the second heat-generating component by a second bolt, and a nut to which the second bolt accommodated in the upper case is fastened is held so as to be displaceable in a direction away from the placement surface of the lower case, thereby constituting a second tolerance absorbing structure, which is included in the at least one tolerance absorbing structure.

The lower case, which is fitted to the upper case, has the placement surface, i.e. a surface to be placed on a heat-dissipation target. The placement surface includes the opening portion that exposes the heat-dissipating portion of the second heat-generating component metal plate. The lower case having the second metal plate positioning portion positioning the heat-dissipating portion and the placement surface such that the heat-dissipating portion and the placement surface are flush with each other suppresses or prevents a step from occurring between the heat-dissipating portion and the placement surface to cause a malfunction that may adversely affect the fixation of the insulating film. In addition, the connecting section of the second heat-generating component metal plate with the heat-dissipating portion positioned on the lower case side needs to be connected to the connecting portion of the second heat-generating component. Since the circuit assembly has the second tolerance absorbing structure absorbing tolerances at the connecting position between the connecting section and the connecting portion, the connecting section of the second heat-generating component metal plate with the heat-dissipating portion positioned by the lower case can be connected to the connecting portion of the second heat-generating component without a problem.

(11) In the above configuration (10), it is preferable that the insertion hole includes a first region into which the connecting section is allowed to be inserted, and a second region into which the joint portion is allowed to be inserted, and a lid portion covering the first region of the insertion hole is removably fixed to the placement surface.

After work for fastening the connecting section of the second heat-generating component metal plate to the connecting portion of the heat-generating component has been performed, the lid portion can cover the insertion hole that is open wide and exposes the connecting section of the second heat-generating component metal plate, which serves as a current-carrying portion. This can advantageously achieve measures to prevent electric shock and further improve waterproofness inside the case.

DETAILS OF EMBODIMENTS OF THE PRESENT DISCLOSURE

Specific examples of the circuit assembly of the present disclosure will be described below with reference to the drawings. It should be noted that the present disclosure is not limited to these examples but is indicated by the claims, and is intended to include all the changes made within the meaning and scope equivalent to the claims.

Embodiment 1

A circuit assembly 10 of Embodiment 1 of the present disclosure will be described below with reference to FIGS. 1 to 8. The circuit assembly 10 of Embodiment 1 is mounted in a vehicle (not shown), such as an electric automobile or a hybrid automobile, to supply electric power to loads (not shown), such as a motor, from a power source (not shown), such as a battery, and control the power supply. Although the circuit assembly 10 can be disposed in any direction, the following description assumes that an X direction, a Y direction, and a Z direction in the figures are a forward direction, a leftward direction, and an upward direction, respectively. When there are a plurality of identical members, only some of them may be assigned a reference numeral, and the other of them may not.

Circuit Assembly 10

Figure 2:
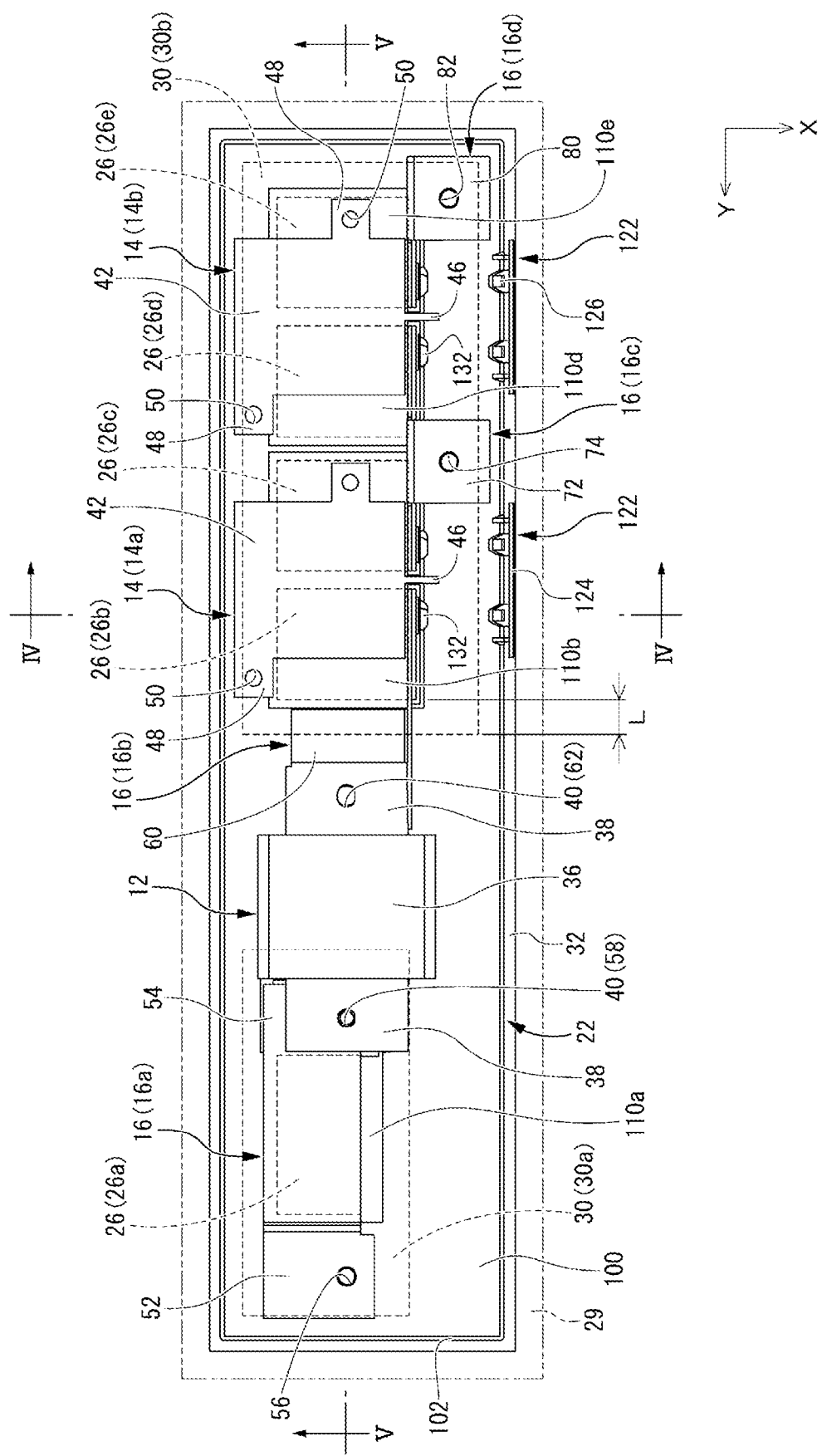
FIG. 2 is a plan view of the circuit assembly shown in FIG. 1 with an upper case removed.
Figure 3:
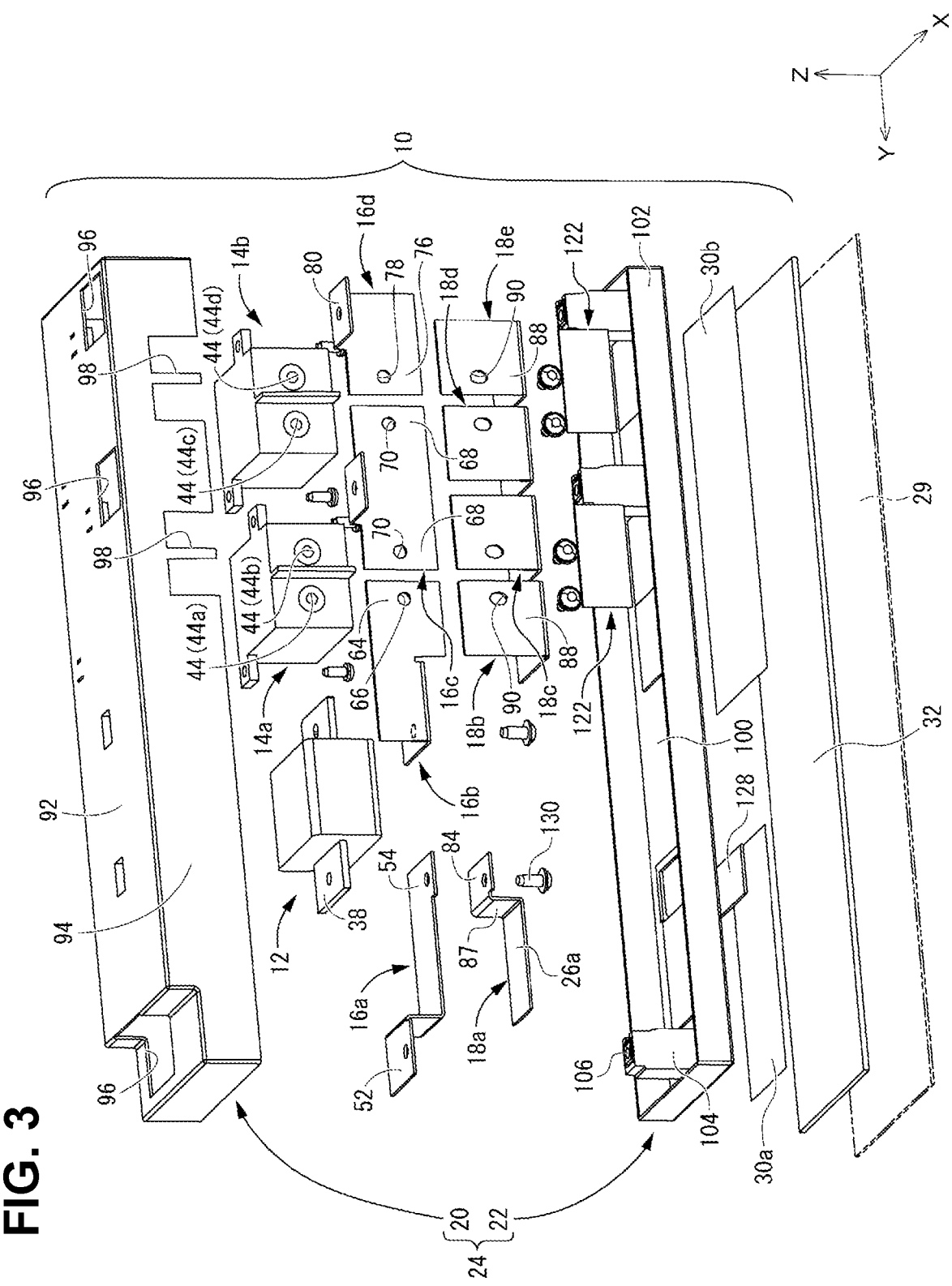
FIG. 3 is an exploded perspective view of the circuit assembly shown in FIG. 1.

The circuit assembly 10 includes heat-generating components that generate heat when a current flows therethrough, namely a fuse 12, which is a second heat-generating component, and relays 14, each of which is a first heat-generating component, as shown in FIGS. 1 to 3. The circuit assembly 10 also includes current-carrying bus bars 16 connected to later-described connecting portions 38 and 44 of the fuse 12 and the relays 14, and heat-dissipating bus bars 18, which are metal plates connected to the connecting portions 38 and 44 of the fuse 12 and the relays 14. The circuit assembly 10 includes a case 24 constituted by an upper case and a lower case 22. The case 24 houses the fuse 12, the relays 14, the current-carrying bus bars 16, and the heat-dissipating bus bars 18. Each heat-dissipating bus bar 18 includes a heat-dissipating portion 26, which is exposed to the outside of the case 24 through an opening portion 28 provided in the case 24 and comes into thermal contact with a metal housing 29, such as a housing of a battery pack, which is an external heat-dissipation target. That is, the heat-dissipating portion 26 being exposed to the outside through the opening portion 28 in the case 24 means that the heat-dissipating portion 26 is capable of coming into thermal contact with a heat-dissipation target outside the case 24, without via the case 24.

The circuit assembly 10 includes insulating films 30 that seal the opening portions 28, and a filler 32 serving as a thermal conductive filling member. The insulating films 30 cover contact surfaces 34 of the heat-dissipating portions 26 that comes into contact with the housing 29, and are fixed to the case 24. The filler 32 is in thermal contact with the heat-dissipating portions 26 via the insulating films and is disposed between the insulating films 30 and the housing 29. The heat-dissipating portions 26 come into thermal contact with the housing 29 via the insulating films 30 and the filler 32. Note that FIGS. 1 to 3 show the housing 29 with dash-double dotted lines.

In Embodiment 1, two relays 14 are located next to each other in the left-right direction, the left relay 14 is referred to as a first relay 14a, and the right relay 14 is referred to as a second relay 14b. The fuse 12 is located to the left of the first relay 14a on the left side. Also, four current-carrying bus bars 16 are provided, namely first to fourth current-carrying bus bars 16a to 16d from left to right. Further, five heat-dissipating bus bars 18 are provided, namely first to fifth heat-dissipating bus bars 18a to 18e from left to right. Furthermore, two insulating films 30 are located next to each other in the left-right direction, the left insulating film 30 is referred to as a first insulating film 30a, and the right insulating film 30 is referred to as a second insulating film 30b.

Fuse 12 and First and Second Relays 14a and 14b

The fuse 12 includes a fuse body 36 having a substantially rectangular-parallelepiped shape. The fuse body 36 includes metallic connecting portions 38 that protrude toward both sides in the left-right direction. These connecting portions 38 each have a bolt insertion hole 40 that extends therethrough in the up-down direction. The right bolt insertion hole 40 of Embodiment 1 has an elongated hole shape having a larger dimension in the left-right direction than the dimension in the front-back direction. This makes it possible to absorb assembly errors, tolerances, or the like when the current-carrying bus bars 16 and other members are fitted to the fuse 12.

The first and second relays 14a and 14b each have a relay body 42 having a rectangular-parallelepiped shape. Two connecting portions 44 are provided in a front face of each relay body 42, and are spaced apart from each other in the left-right direction. That is, the first relay 14a and the second relay 14b include a total of four connecting portions 44, which are referred to as first to fourth connecting portions 44a to 44d from left to right. In other words, the first relay 14a includes the first and second connecting portions 44a and 44b. The second relay 14b includes the third and fourth connecting portions 44c and 44d. Partition plates 46 are provided between the first connecting portion 44a and the second connecting portion 44b of the first relay 14a and between the third connecting portion 44c and the fourth connecting portion 44d of the second relay 14b. The partition plates 46 partition the relays 14a and 14b and protrude forward.

Each relay body 42 also has attachment portions 48 that protrude outward on both sides in the left-right direction. These attachment portions 48 each have a bolt insertion hole 50 that extends therethrough in the up-down direction.

First to Fourth Current-Carrying Bus Bars 16a to 16d

The first to fourth current-carrying bus bars 16a to 16d are formed by bending metal plates into a predetermined shape by means of press working or the like. Although the material of the current-carrying bus bars 16a to 16d is not limited, a material such as copper, a copper alloy, aluminum, or an aluminum alloy is favorably employed.

The first current-carrying bus bar 16a is a member connected to the left connecting portion 38 of the fuse 12, and extends in the left-right direction as a whole. The first current-carrying bus bar 16a has a left end portion serving as an external connecting portion 52, and a right end portion serving as a fuse connecting portion 54. The external connecting portion 52 and the fuse connecting portion 54 have respective bolt insertion holes 56 and 58 that extend through these connecting portions in the up-down direction, which corresponds to the plate thickness direction.

The second current-carrying bus bar 16b is a member that connects the right connecting portion 38 of the fuse 12 to the first connecting portion 44a of the first relay 14a, and extends in the left-right direction as a whole. The second current-carrying bus bar 16b has a left end portion serving as a fuse connecting portion 60, which has a bolt insertion hole 62 that extends therethrough in the up-down direction corresponding to the plate thickness direction. The second current-carrying bus bar 16b also has a right end portion serving as a relay connecting portion 64, which has a bolt insertion hole 66 that extends therethrough in the front-back direction corresponding to the plate thickness direction.

The third current-carrying bus bar 16c is a member that connects the second connecting portion 44b of the first relay 14a to the third connecting portion 44c of the second relay 14b, and extends in the left-right direction as a whole. The third current-carrying bus bar 16c has left and right end portions serving as relay connecting portions 68, each of which has a bolt insertion hole 70 that extends therethrough in the front-back direction corresponding to the plate thickness direction. The third current-carrying bus bar 16c also has a rectangular external connecting portion 72 that protrudes forward at an upper end portion in a middle area in the left-right direction. The external connecting portion 72 has a bolt insertion hole 74 that extends therethrough in the up-down direction corresponding to the plate thickness direction.

The fourth current-carrying bus bar 16d is a member connected to the fourth connecting portion 44d of the second relay 14b, and extends in the left-right direction as a whole. The fourth current-carrying bus bar 16d has a left end portion serving as a relay connecting portion 76, which has a bolt insertion hole 78 that extends therethrough in the front-back direction corresponding to the plate thickness direction. The fourth current-carrying bus bar 16d also has a right end portion serving as a rectangular external connecting portion 80 that protrudes forward and has a bolt insertion hole 82 extending therethrough in the up-down direction corresponding to the plate thickness direction.

First to Fifth Heat-Dissipating Bus Bars 18a to 18e

The first to fifth heat-dissipating bus bars 18a to 18e are formed by bending metal plates into a predetermined shape by means of press working or the like. Although the material of the heat-dissipating bus bars 18a to 18e is not limited, the same material as the current-carrying bus bars 16 (the first to fourth current-carrying bus bars 16a to 16d) can be employed.

The first heat-dissipating bus bar 18a is a member connected to the left connecting portion 38 of the fuse 12 (the second heat-generating component), and extends in the left-right direction as a whole. That is, the first heat-dissipating bus bar 18a, of the metal plates (the first to fifth heat-dissipating bus bars 18a to 18e), is a second heat-generating component metal plate that is connected to the second heat-generating component (the fuse 12). The first heat-dissipating bus bar 18a has a left end portion on one end side that serves as a heat-dissipating portion 26 (the first heat-dissipating portion 26a), and expands in the horizontal direction (in the XY plane) with predetermined dimensions in the left-right direction. The first heat-dissipating bus bar 18a also has a right end portion on the other end side that serves as a fuse connecting portion 84, which is a connecting area to the connecting portion 38. The fuse connecting portion 84 is located above (i.e. on the upper case side relative to) the first heat-dissipating bus bar 26a, and expands parallel to the first heat-dissipating portion 26a in the horizontal direction. The fuse connecting portion 84 has a bolt insertion hole 86 that extends therethrough in the up-down direction corresponding to the plate thickness direction. The first heat-dissipating portion 26a and the fuse connecting portion 84 are joined by a joint portion 87 that expands in the up-down direction. The joint portion 87 is raised from the right end of the first heat-dissipating portion 26a toward the left end of the fuse connecting portion 84.

The second to fifth heat-dissipating bus bars 18b to 18e are members connected respectively to the first to fourth connecting portions 44a to 44d of the first and second relays 14a and 14b (the first heat-generating components). That is, the second to fifth heat-dissipating bus bars 18b to 18e, of the metal plates (the first to fifth heat-generating bus bars 18a to 18e), are first heat-generating component metal plates connected to the first heat-generating components (the first and second relays 14a and 14b). The second to fifth heat-dissipating bus bars 18b to 18e are each bent in an L shape as a whole, and have respective heat-dissipating portions 26 (second to fifth heat-dissipating portions 26b to 26e) each expanding in the horizontal direction (in the XY plane) at one end portion. The other end portion of each of the second to fifth heat-dissipating bus bars 18b to 18e is a relay connecting portion 88, which is an area connected to a corresponding one of the first to fourth connecting portions 44a to 44d. The relay connecting portion 88 is raised upward (i.e. toward the upper case 20) from the front end of each of the second to fifth heat-dissipating portions 26b to 26e. As will be described later, the relay connecting portions 88 are bolted, together with the relay connecting portions 64, 68, and 76 of the second to fourth current-carrying bus bars 16b to 16d, to the first to fourth connecting portions 44a to 44d. That is, the relay connecting portions 88 are later-described fastening sections, i.e. sections of the second to fifth heat-dissipating bus bars 18b to 18e that are fastened by first bolts 132.

Each relay connecting portion 88 has a bolt insertion hole 90 that extends therethrough in the front-back direction corresponding to the plate thickness direction. The bolt insertion hole 90 of Embodiment 1 extends in the up-down direction (the direction in which upper case 20 and the lower case 22 are fitted to each other), and has an elongated hole shape having a larger dimension in the up-down direction than the dimension in the left-right direction. As will be described later, the second to fifth heat-dissipating portions 26b to 26e of the second to fifth heat-dissipating bus bars 18b to 18e are accommodated in second to fifth recessed portions 108b to 108e and positioned by second to fifth positioning portions 110b to 110e. In this state, the bolt insertion hole 90 can absorb tolerances of the first to fourth connecting portions 44a to 44d of the first and second relays 14a and 14b and the connecting sections (the relay connecting portions 88) of the second to fifth heat-dissipating bus bars 18b and 18e. Accordingly, the circuit assembly 10 of Embodiment 1 has, as one tolerance absorbing structure, a first tolerance absorbing structure that is constituted by the bolt insertion holes 90 and absorbs the tolerances of the connecting sections (the relay connecting portions 88) of the second to fifth heat-dissipating bus bars 18b to 18e and the first to fourth connecting portions 44a to 44d at the respective connecting positions.

Upper Case 20

The upper case 20 is made of synthetic resin, and has a box shape that is open downward and elongated in the left-right direction as a whole, as shown in FIG. 3. That is, the upper case 20 includes a top wall 92 that has a substantially rectangular shape and extends in the left-right direction as a whole. The upper case 20 has a side wall 94 that protrudes downward (i.e. toward the lower case 22) at an outer peripheral edge of the top wall 92. The top wall 92 has a plurality of open windows 96 that extend therethrough in the plate thickness direction (up-down direction) at a left end portion and in a right area. These open windows 96 are formed at positions corresponding to the external connecting portions 52, 72, and 80 of the first, third, and fourth current-carrying bus bars 16a, 16c, and 16d. With this, the external connecting portions 52, 72, and 80 are exposed to the outside through the open windows 96 in the circuit assembly 10 in an assembled state. A front wall portion of the side wall 94 has a plurality of open windows 98 that are open downward and extend therethrough in the plate thickness direction (front-back direction). These open windows 98 are formed at positions corresponding to the first to fourth connecting portions 44a to 44d of the first and second relays 14a and 14b.

Note that nuts 99 (see FIG. 5) are fitted to a lower face of the top wall 92 at positions corresponding to the bolt insertion holes 40 in the connecting portions 38 of the fuse 12 and the bolt insertion holes 50 in the attachment portions 48 of the first and second relays 14a and 14b. In Embodiment 1, an upper section of each nut 99 protrudes toward the outer peripheral side, and a lower face of the top wall 92 has elastically deformable claw portions. The nuts 99 are fitted to the top wall 92 as a result of the claw portions being locked at protruding sections of the nuts 99. A gap S (see FIG. 5) is provided between the top wall 92 and each nut 99 in the up-down direction, and the nut 99 is fitted to the top wall 92 with some degree of looseness. Note that the gap S is largest and each nut 99 is located at an end of downward displacement in an initial state before a later-described second bolt 130 is fastened to the nut 99.

Figure 5:
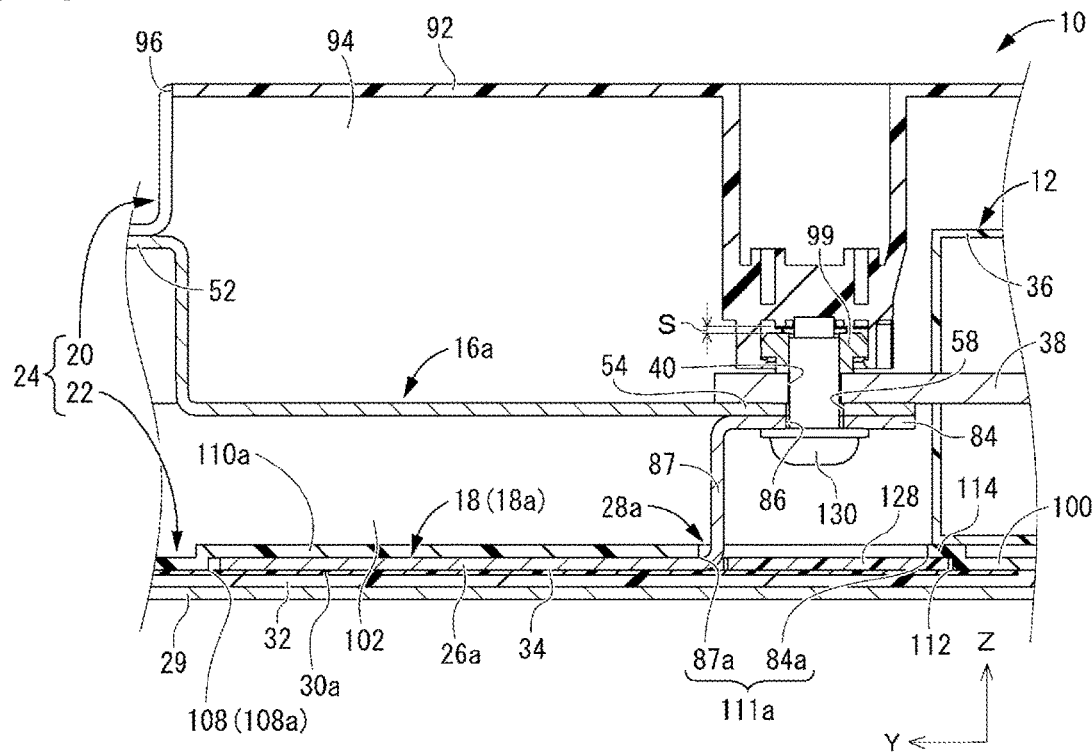
FIG. 5 is a cross-sectional view of FIG. 2 taken along a line indicated by arrows V-V

As shown in FIG. 5, one of the connecting portions 38 of the fuse 12, the fuse connecting portion 54 of the first current-carrying bus bar 16a and the fuse connecting portion 84 of the first heat-dissipating bus bar 18a is stacked with each other relative to the nut 99. Here, the tolerances of these members are absorbed due to the nut 99 being displaced upward (i.e. in a direction away from a later-described placement surface 107). That is, the first heat-dissipating portion 26a of the first heat-dissipating bus bar 18a is accommodated in the first recessed portion 108a and positioned by the first positioning portion 110a, as will be described later. The nut 99 is displaceable in a direction away from the placement surface 107 in this state, and can thus absorb the tolerances of the connecting portion 38 of the fuse 12 and the connecting section (the fuse connecting portion 84) of the first heat-dissipating bus bar 18a at the connecting position. Accordingly, the circuit assembly 10 of Embodiment 1 has, as another tolerance absorbing structure, a second tolerance absorbing structure that absorbs the tolerances of the connecting section (the fuse connecting portion 84) of the first heat-dissipating bus bar 18a and the connecting portion 38 at the connecting position, and is a structure in which the nut 99 is displaceable in a direction away from the placement surface 107.

Note that the method of fixing the nut 99 to the lower face of the top wall 92 is not limited to the fitting between a protrusion and a recess as mentioned above, and may alternatively be welding, adhesion, indentation, insert molding, or the like. Here, the gap S between the top wall 92 and the nut 99 is not essential, and the nut 99 may alternatively be fixed to the top wall 92 in a non-displaceable manner.

Lower Case 22

Figure 6:
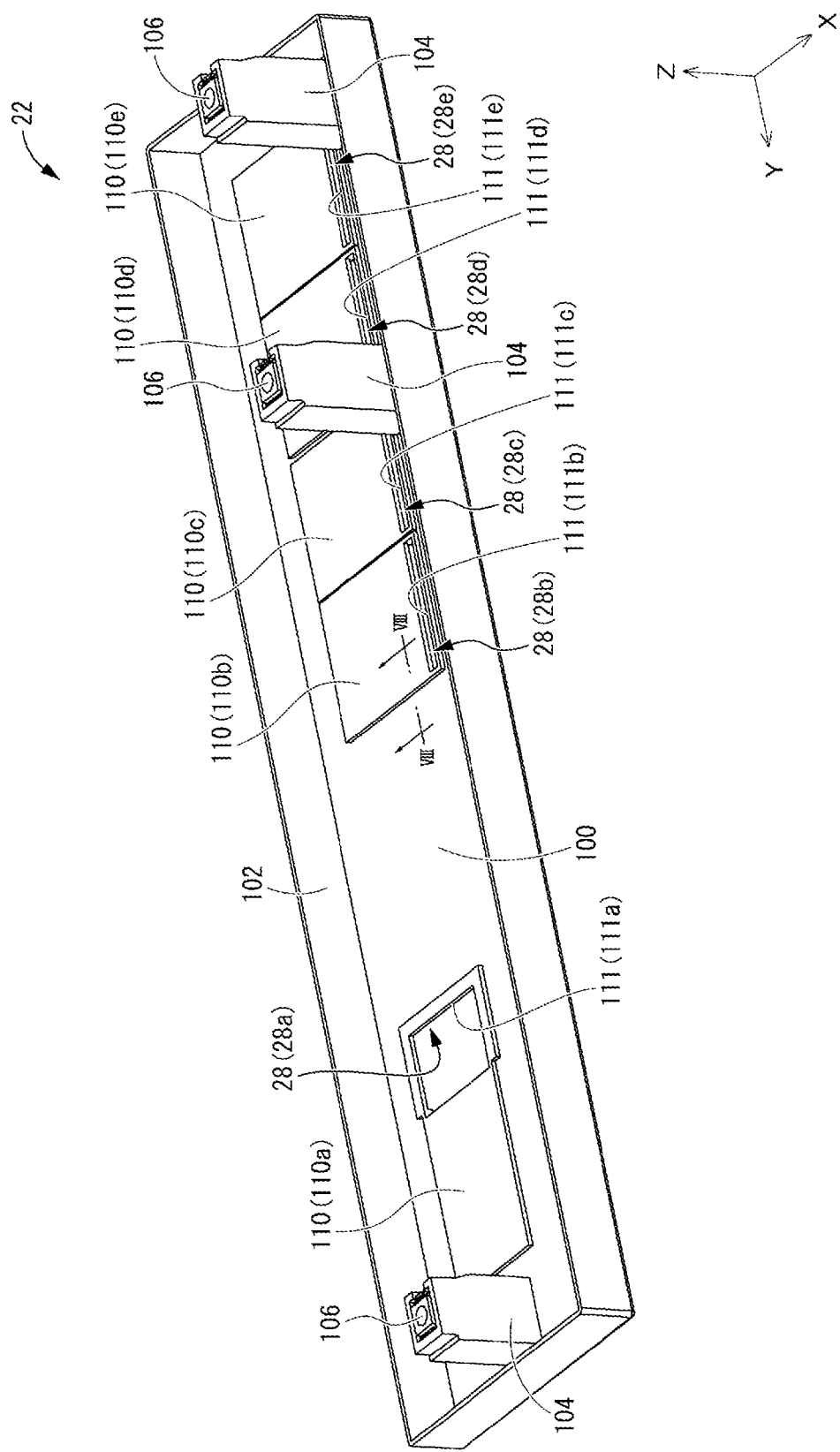
FIG. 6 is a perspective view of a lower case that constitutes the circuit assembly shown in FIG. 1, as viewed from a flat face side.

The lower case 22 is made of synthetic resin, and has a box shape that is open upward and elongated in the left-right direction as a whole, as shown in FIG. 6. That is, the lower case 22 includes a bottom wall 100 that has a substantially rectangular shape and extends in the left-right direction as a whole. A peripheral wall 102 that protrudes upward is provided at an outer peripheral edge of the bottom wall 100.

The bottom wall 100 has a plurality of support portions 104 that protrude upward at a left end portion and in a right area. These support portions 104 are formed at positions corresponding to the external connecting portions 52, 72, and 80 of the first, third, and fourth current-carrying bus bars 16a, 16c, and 16d. With this, the support portions 104 support the external connecting portions 52, 72, and from below in the circuit assembly 10 in an assembled state. A nut 106 is fixed to the upper end of each support portion 104. The method for fixing the nuts 106 to the support portions 104 can be the same as the aforementioned method for fixing the nuts 99 to the lower face the top wall 92.

Figure 4:
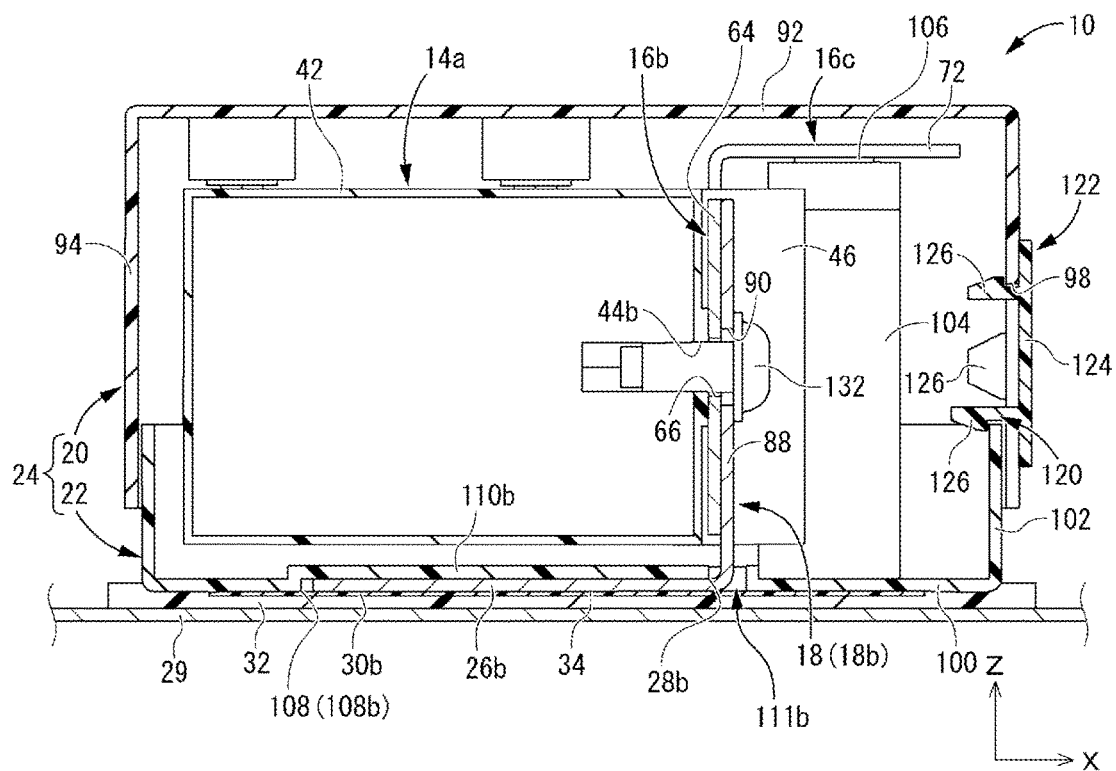
FIG. 4 is a cross-sectional view of FIG. 2 taken along a line indicated by arrows IV-IV.
Figure 7:
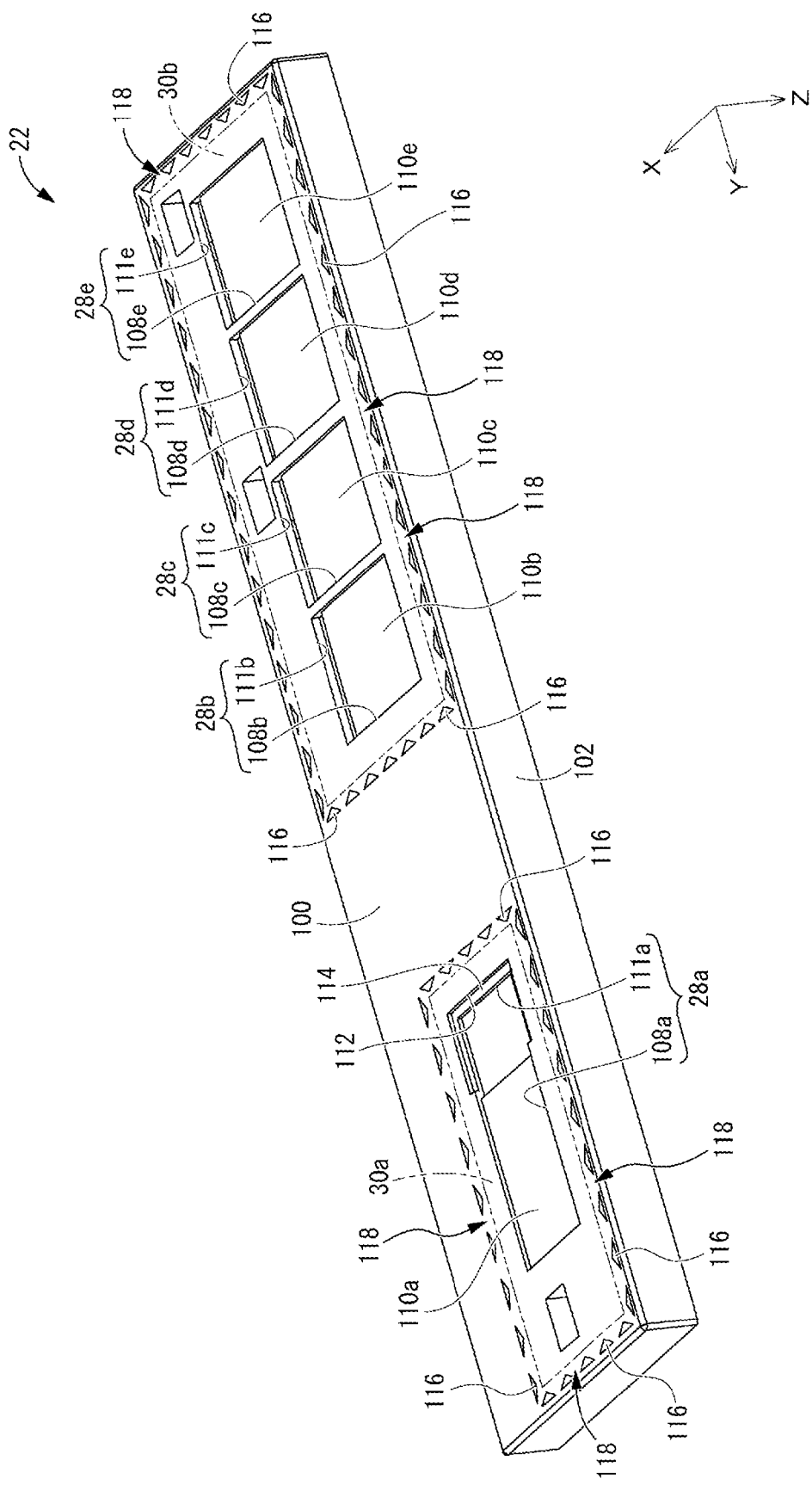
FIG. 7 is a perspective view of the lower case shown in FIG. 6, as viewed from a bottom face side.
Figure 8:
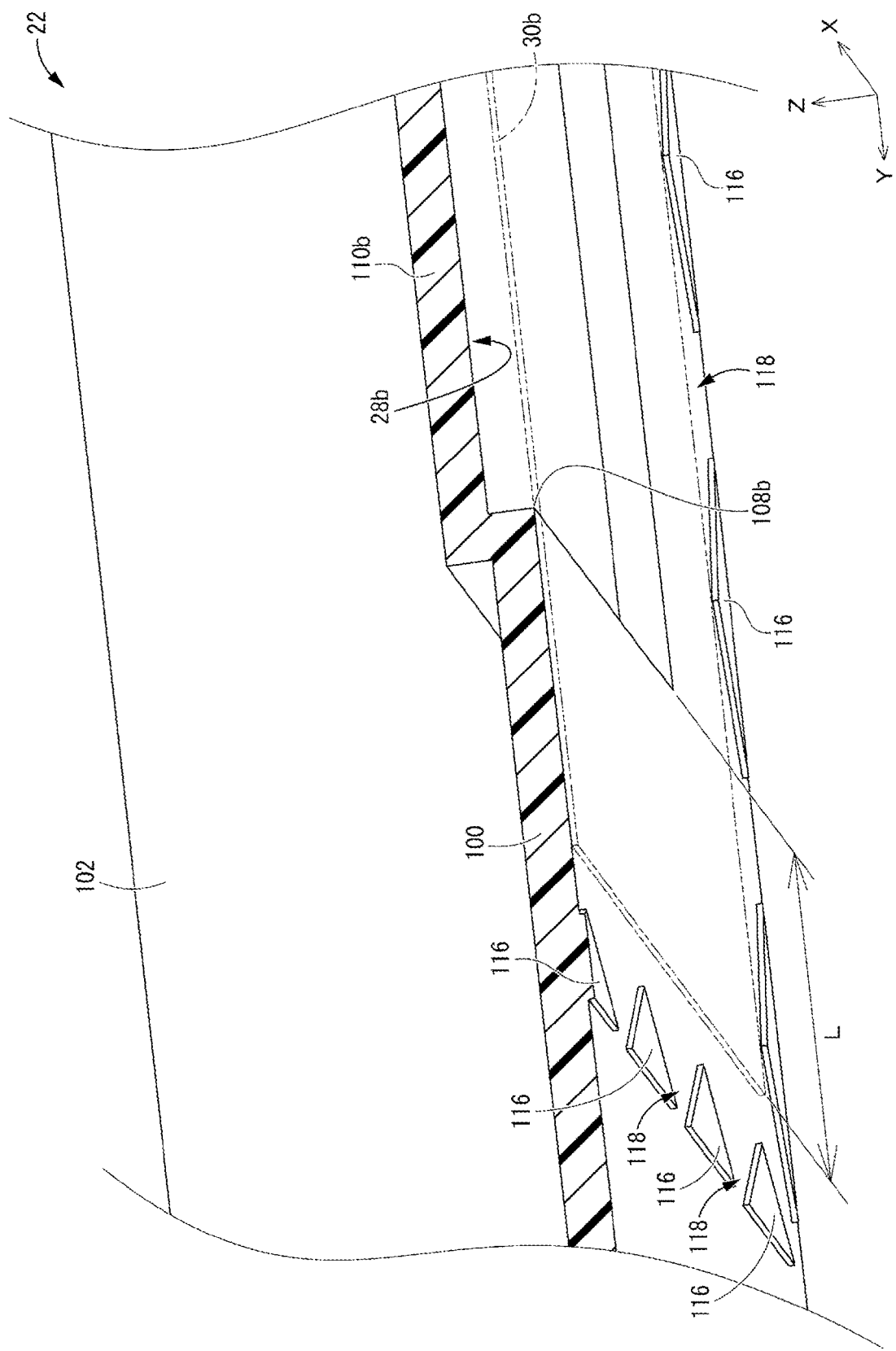
FIG. 8 is an enlarged view of the bottom face of the lower case shown in FIG. 7, and is a cross-sectional perspective view of an area corresponding to a cross section of FIG. 6 taken along a line indicated by arrows VIII-VIII.

Further, the lower case 22 is placed on the housing 29 via the insulating films 30 (the first and second insulating films 30a and 30b) and a filler 32, as shown in FIGS. 4 and 5 and other figures. Thus, a lower face of the bottom wall 100 of the lower case 22 serves as the placement surface 107 to be placed on a heat-dissipation target (the housing 29) that expands in the horizontal direction (in the XY plane). As shown in FIGS. 7 and 8 and other figure, the placement surface 107 has recessed portions 108 (first to fifth recessed portions 108a to 108e) for accommodating the heat-dissipating portions 26a to 26e of the heat-dissipating bus bars 18a to 18e, as will be described later.

That is, the first to fifth recessed portions 108a to 108e is substantially as large as or slightly larger than the first to fifth heat-dissipating portions 26a to 26e, respectively, in a plan view. The first to fifth recessed portions 108a to 108e are bottomed recessed portions that are open downward, and top plates of the recessed portions 108a to 108e are constituted by the bottom wall 100 of the lower case 22. The depth dimension of the first to fifth recessed portions 108a to 108e is substantially equal to the plate thickness dimension of the first to fifth heat-dissipating portions 26a to 26e, respectively. With this, the placement surface 107 can be made flush with the lower faces of the first to fifth heat-dissipating portions 26a to 26e when the first to fifth heat-dissipating portions 26a to 26e are accommodated in the first to fifth recessed portions 108a to 108e, as will be described later.

In Embodiment 1, the plate thickness dimension of the bottom wall 100 of the lower case 22 is substantially fixed as a whole. In the areas where the recessed portions 108a to 108e are provided, an upper face of the bottom wall 100 protrudes upward and is recessed toward the upper case 20 by the depth dimension of the recessed portions 108a to 108e, relative to the other area. The positioning portions 110 (first to fifth positioning portions 110a to 110e) for positioning the heat-dissipating portions 26a to 26e of the heat-dissipating bus bars 18a to 18e, as will be described later, are portions that constitute the top plates of the recessed portions 108a to 108e and are located above the other area of the upper face of the bottom wall 100. Specifically, the first positioning portion 110a is a second metal plate positioning portion for positioning the second heat-generating component metal plate (the first heat-dissipating bus bar 18a). The second to fifth positioning portions 110b to 110e are first metal plate positioning portions for positioning the first heat-generating component metal plates (the second to fifth heat-dissipating bus bars 18b to 18e).

The bottom wall 100 has insertion holes 111 that extend therethrough in the up-down direction, as shown in FIGS. 4 and 5 and other figures. The insertion holes 111 are open in the upper face and the lower face (placement surface 107) of the bottom wall 100. The insertion holes 111 are connected to the recessed portions 108 in the placement surface 107. That is, the bottom wall 100 has first to fifth insertion holes 111a to 111e that are connected to the first to fifth recessed portions 108a to 108e, respectively. The first to fifth recessed portions 108a to 108e and the first to fifth insertion holes 111a to 111e form, in the placement surface 107, the opening portions 28 (the first to fifth opening portions 28a to 28e) that expose the first to fifth heat-dissipating portions 26a to 26e of the first to fifth heat-dissipating bus bars 18a to 18e to the outside. In short, a part of each of the first to fifth opening portions 28a to 28e is a bottomed opening portion (the first to fifth recessed portions 108a to 108e) having a bottom portion (top plate). The remaining part is a bottomless opening portion (the first to fifth insertion holes 111a to 111e) that extends through the bottom wall 100. The second to fifth insertion holes 111b to 111e of Embodiment 1 each have a slit shape having a larger dimension in the left-right direction than the dimension in the front-back direction.

Specifically, the first insertion hole 111a is connected to the right side of the first recessed portion 108a. The second to fifth insertion holes 111b to 111e are connected to the front side of the second to fifth recessed portions 108b to 108e, respectively. The first insertion hole 111a is larger than the fuse connecting portion 84 and the joint portion 87 of the first heat-dissipating bus bar 18a in a plan view (projection in the up-down direction). As shown in FIG. 5, the first insertion hole 111a includes a first region 84a that allows the fuse connecting portion 84 of the first heat-dissipating bus bar 18a to be inserted, and a second region 87a that allows the joint portion 87 to be inserted. The second to fifth insertion holes 111b to 111e are larger than the relay connecting portions 88 of the second to fifth heat-dissipating bus bars 18b to 18e, respectively, in a plan view.

In Embodiment 1, the opening dimension at a lower opening portion of the first insertion hole 111a is large, and a lid accommodating portion 112 for accommodating a later-described lid portion 128 is formed in the placement surface 107. Specifically, the lid accommodating portion 112 has an opening that is larger than the first insertion hole 111a on the right side and the front and rear sides, and the left side of the lid accommodating portion 112 is connected to the first recessed portion 108a. That is, the lid accommodating portion 112 is open downward, and has a bottom section 114 that is constituted by the bottom wall 100 of the lower case 22, on the right side and the front and rear sides.

In Embodiment 1, the lower face (placement surface 107) of the bottom wall 100 has protrusions 116 that protrude downward and are arranged over the entire periphery of the first opening portion 28a, as shown in FIG. 8. The protrusions 116 are also arranged over the entire periphery of the second to fifth opening portions 28b to 28e. In Embodiment 1, a plurality of protrusions 116 are spaced apart from each other in the circumferential direction. A gap 118 is formed between two protrusions 116 adjacent to each other in the circumferential direction. Specifically, in Embodiment 1, each protrusion 116 has a triangular shape in a plan view (projection in the up-down direction), and is gradually tapered toward the first opening portion 28a and the second to fifth opening portions 28b to 28e that are located inward of the protrusions 116. With this, each gap 118 between the protrusions 116 gradually expands inward from the outer side. Although the size of each gap 118 between the protrusions 116 is not limited, a size that does not allow a user's finger to be inserted into the gap 118 is favorable, for example.

Case 24

The case 24 is formed by fitting the above-described upper case 20 and lower case 22 to each other. In Embodiment 1, the opening portion of the upper case 20 is larger than the opening portion of the lower case 22, and the upper case 20 is fitted from above so as to cover the opening portion of the lower case 22 from the outer side. That is, in Embodiment 1, the upper case 20 and the lower case 22 are fitted to each other in the up-down direction. The method for fixing the upper case 20 and the lower case 22 to each other is not limited. For example, it is possible to provide the upper case 20 and the lower case 22 with a recess and a protrusion that fit to each other such that the upper case 20 and the lower case 22 are fixed to each other by fitting the recessed portion and the protruding portion to each other.

In Embodiment 1, the four open windows 98 are formed in the front wall portion of the side wall 94 of the upper case 20, and the peripheral wall 102 of the lower case 22 closes lower opening portions of these open windows 98 when the upper case 20 and the lower case 22 are fitted to each other. Thus, the case 24 has rectangular work holes 120 (see FIG. 4) that extend therethrough in the thickness direction at the positions where the open windows 98 are formed. In Embodiment 1, caps 122 for closing the work holes 120 are attached to the case 24. Specifically, four work holes 120 are provided in Embodiment 1. Here, one cap 122 is capable of closing two adjacent work holes 120, and two caps 122 are attached to the case 24.

Each cap 122 has a base plate portion 124 having a rectangular flat-plate shape. The base plate portion 124 has a plurality of claw portions 126 that protrude toward one side in the plate thickness direction. Each cap 122 is attached to the case 24 by putting the base plate portion 124 on the side wall 94 of the upper case 20 and locking the claw portions 126 to opening edges of the work hole 120. Specifically, the claw portions 126 are locked at upper and lower opening edges and either left or right opening edge of the work hole 120. That is, the upper claw portion 126 is locked at an upper edge of the open window 98, and the lower claw portion 126 is locked at an opening edge of the peripheral wall 102 of the lower case 22.

In Embodiment 1, the first insertion hole 111a that is open in the lower face (placement surface 107) of the case 24 (lower case 22) is closed by the lid portion 128 having a rectangular flat-plate shape. This lid portion 128 is formed so as to be larger than the first insertion hole 111a and smaller than the lid accommodating portion 112 in a plan view (projection in the up-down direction). With this, the lower opening portion of the first insertion hole 111a is closed by bringing a peripheral section of the lid portion 128 into contact with the bottom section 114 of the lid accommodating portion 112 such that the lid portion 128 is accommodated in the lid accommodating portion 112. Specifically, the fuse connecting portion 84 and the joint portion 87 of the first heat-dissipating bus bar 18a are inserted into the case 24 (lower case 22) through the first region 84a and the second region 87a of the first insertion hole 111a, and the first heat-dissipating portion 26a of the first heat-dissipating bus bar 18a extends to the outside from the inside of the case 24 (lower case 22) through the joint portion 87, as will be described later. That is, the lid portion 128 is fixed to as to cover the first region 84a of the first insertion hole 111a.

The plate thickness dimension of the lid portion 128 is substantially equal to the depth dimension of the lid accommodating portion 112 (i.e. the dimension in the up-down direction from the placement surface 107 to the bottom section 114 of the lid accommodating portion 112). With this, the placement surface 107, the lower face of the first heat-dissipating portion 26a, and the lower face of the lid portion 128 are flush with each other when the lid portion 128 is accommodated in the lid accommodating portion 112, as will be described later.

Note that the method for fixing the lid portion 128 to the lid accommodating portion 112 may be such that the lid portion 128 is simply placed on the bottom section 114 of the lid accommodating portion 112 and fixed thereto by sticking the first insulating film 30a thereto from the outer side, as will be described. Alternatively, for example, a protrusion that protrudes toward the inner peripheral side may be provided at a lower opening portion of the lid accommodating portion 112, and the lid portion 128 may be held while being accommodated in the lid accommodating portion 112 as a result of the lid portion 128 moving over the protrusion and then being accommodated in the lid accommodating portion 112. The lid portion 128 can be removed from the lid accommodating portion 112 by peeling the first insulating film 30a, or by first peeling the first insulating film 30a and then moving the lid portion 128 over the protrusion of the lower opening portion of the lid accommodating portion 112. In short, the lid portion 128 may be removably fixed to the lid accommodating portion 112 provided in the placement surface 107.

First and Second Insulating Films 30a and 30b

As shown in FIGS. 4 and 5, the first and second insulating films 30a and are fixed to the lower face of the case 24 (lower case 22). The first and second insulating films 30a and 30b are made of waterproof, electrically insulating synthetic resin, and each have a rectangular shape. Specifically, the first insulating film 30a has a size that allows the first insulating film 30a to cover the first opening portion 28a, as indicated by dash-double dotted lines in FIGS. 7 and 8. The second insulating film 30b has a size that allows the second insulating film 30b to cover the second to fifth opening portions 28b to 28e. Note that the thickness dimension of the first and second insulating films 30a and 30b is not limited. The thickness dimension of the first and second insulating films 30a and 30b is preferably 500 μm or less, for example, more preferably 250 μm or less. Setting the thickness dimension of the first and second insulating films 30a and 30b to the above range enables excellent thermal conductivity. Note that FIGS. 4 and 5 show the thickness dimension of the first and second insulating films 30a and 30b in an exaggerated manner for ease of viewing.

The material of the first and second insulating films 30a and 30b may be, for example, polyethylene terephthalate (PET), polyethylene naphthalate (PEN), polytetrafluoroethylene (PTFE), polycarbonate (PC), polyimide (PI), or the like. Specifically, for example, Kapton (registered trademark) manufactured by Du Pont-Toray Co., Ltd. can be employed.

The first and second insulating films 30a and 30b of Embodiment 1 are larger than the first opening portion 28a and the second to fifth opening portions 28b to 28e, respectively, over the entire periphery, i.e. in both the front-back direction and the left-right direction in a plan view (projection in the up-down direction). The first insulating film 30a has a size that allows the first insulating film 30a to be accommodated inward of the plurality of protrusions 116 provided around the first opening portion 28a on the lower face (placement surface 107) of the lower case 22. The second insulating film 30b has a size that allows the second insulating film 30b to be accommodated inward of the plurality of protrusions 116 provided around the second to fifth opening portions 28b to 28e. In other words, the plurality of protrusions 116 are arranged around the peripheral edge of the first insulating film and the peripheral edge of the second insulating film 30b, respectively. Although the size of the gap through which the first insulating film 30a faces the protrusions 116 and the size of the gap through which the second insulating film 30b faces the protrusions 116 are not limited, it is preferable that these gaps has a size that does not allow a user's finger to be inserted therein, for example.

Note that the method for fixing the first and second insulating films 30a and to the lower face (placement surface 107) of the lower case 22 may be such that the first and second insulating films 30a and 30b themselves each have an adherent face and are stuck to the placement surface 107, for example. Alternatively, at least either the placement surface 107 (including the lower faces of the first to fifth heat-dissipating portions 26a to 26e and the lower face of the lid portion 128) or the first and second insulating films 30a and 30b may be applied an adhesive such that the first and second insulating films 30a and 30b are stuck to the placement surface 107. It is preferable that the aforementioned adherent face or adhesive is provided over the entire surfaces of the first and second insulating films 30a and 30b. The first and second insulating films 30a, 30b themselves need not be waterproof if waterproofness can be achieved by the aforementioned adhesive. The method for fixing the first and second insulating films 30a and 30b to the placement surface 107 of the lower case 22 is not limited, and may be a known method, such as adhesion or welding.

In Embodiment 1, the size of the first and second insulating films 30a and is relatively larger than the first heat-dissipating portion 26a and the second to fifth heat-dissipating portions 26b to 26e, respectively. Specifically, for example, a portion of the second insulating film 30b to be stacked with and stuck to the lower face (placement surface 107) of the lower case 22 has a relatively large length dimension L (see FIGS. 2 and 8) in the left-right direction, on the outer side, in the left-right direction, of the second to fifth heat-dissipating portions 26b to 26e. The specific length of this length dimension L is not limited, but may be, for example, 11 mm to 12 mm. This enables the distance along the surfaces between the second heat-dissipating bus bar 18b and the housing 29 to be made large, thereby preventing unintentional electric short circuit.

Filler 32

The filler 32 need only be a member that has thermal conductivity (heat dissipation) and fills the space between the case 24 (lower case 22), the first and second insulating films 30a and 30b, and the housing 29. That is, the first to fifth heat-dissipating portions 26a to 26e come into thermal contact with the housing 29 via the first and second insulating films 30a and 30b and the filler 32 disposed on the first and second insulating films 30a and 30b side. Accordingly, the lower faces of the first to fifth heat-dissipating portions 26a and 26e serve as contact surfaces 34 that come into contact with the housing 29, and the first and second insulating films 30a and 30b cover these contact surfaces 34.

The filler 32 is made of electrically insulating synthetic resin, for example. In Embodiment 1, the filler 32 is separate from the first and second insulating films 30a and 30b, and is preferably elastic, for example. This makes it possible to absorb unevenness formed due to the protrusions 116 provided on the lower face (placement surface 107) of the lower case 22 and the first and second insulating films 30a and 30b. The filler 32 can be understood as a material generally referred to as an elastic material or filler, for example, and can be a conventionally known thermal interface material or a heat-dissipating gap filler, for example. For example, a composite material obtained by filling resin, such as epoxy resin or silicone resin, with a thermal conductive filler is employed as the filler 32. For example, any of alumina (aluminum oxide), boron nitride, aluminum nitride, silicon nitride, or the like is used as the thermal conductive filler to fill the resin. Note that the thermal conductive filling material can be in any of various forms, such as a sheet form, a gel form, and a grease form.

Embodiment 1 employs, as the filler 32, a gap filler that is in a grease form when applied to the lower faces of the lower case 22 and the first and second insulating films 30a and 30b, and is cured into a sheet form with heat (e.g. at room temperature). Employing this type of filler 32 advantageously prevents air from entering between the lower case 22, the first and second insulating films 30a and and the filler 32 and between the filler 32 and the housing 29, and improves heat dissipation. For example, SDP series manufactured by Shin-Etsu Chemical Co., Ltd., or the like can be employed as this type of filler 32. Note that the filler 32 may also exhibit some degree of elasticity before and after assembly.

For example, if the filler 32 is in a grease form as in Embodiment 1, the filler 32 is indefinite in shape and does not have a predetermined shape before assembly. FIG. 3 shows a rectangular filler 32 after being cured. Note that FIG. 3 shows, as the filler 32, lines corresponding to the outer peripheral edges of the first and second insulating films 30a and 30b, the protrusions 116, and the lower case 22. Here, in the case where the filler 32 is in a grease form before assembly, these lines merely indicates a transfer of the lower faces of the lower case 22 and the first and second insulating films 30a and 30b to the cured filler 32. The filler 32 may be cured with ultraviolet rays (UV) or the like, for example, rather than heat (e.g. at room temperature or a temperature higher or lower room temperature). Meanwhile, the filler 32 is not limited to the above mode, and may alternatively be made of rubber, elastomer, or the like, and formed into a rectangular plate shape to have some degree of strength in an initial state before assembly, for example. In this case, recessed portions corresponding to the outer peripheral edge of the lower case 22, the protrusions 116, and the first and second insulating films 30a and 30b may be formed in advance in the initial state. Note that the shape of the filler 32 (or the shape of the cured filler 32) is not limited to a rectangular plate shape.

The filler 32 of Embodiment 1 is provided between the lower case 22 and the housing 29 over a region wider than the lower case 22 in a plan view. That is, in Embodiment 1, the disposal region of the first and second insulating films 30a and 30b, i.e. the region where the first and second insulating films 30a and 30b are disposed, is different from the disposal region of the filler 32, i.e. the region where the filler 32 is disposed. Specifically, the filler 32 is arranged in an area larger than the area of the first and second insulating films 30a and 30b in a plan view (projection in the up-down direction; a view from the direction in which the filler 32 is stacked with the housing 29).

Assembly Process of Circuit Assembly 10

Next, a specific example of the assembly process of the circuit assembly 10 will be described. Note that the assembly process of the circuit assembly 10 is not limited to the following.

First, the upper case 20, the fuse 12, the first and second relays 14a and 14b, the first to fourth current-carrying bus bars 16a to 16d, and the first to fifth heat-dissipating bus bars 18a to 18e are prepared. Thereafter, the first and second relays 14a and 14b are placed onto the top wall 92 of the upper case 20 that is vertically inverted, and the second bolts 130 are inserted into the bolt insertion holes 50 in the attachment portions 48 and fastened to the nuts 99. The first and second relays 14a and 14b are thus fixed to the upper case 20. The fuse 12 and the first to fourth current-carrying bus bars 16a to 16d are also placed onto the top wall 92. Then, the right bolt insertion hole 40 in the fuse 12 and the bolt insertion hole 62 in the fuse connecting portion 60 of the second current-carrying bus bar 16b are positioned relative to each other, and the second bolt 130 is inserted into these bolt insertion holes 40 and 62 and fastened to the nut 99.

Next, the lower case 22 is fitted to the vertically inverted upper case 20 from the upper opening portion thereof. The upper case 20 and the lower case 22 are fixed to each other by means of fitting between a recess and a protrusion (not shown), for example. The case 24 is thus formed. Then, the first to fifth heat-dissipating bus bars 18a to 18e are fitted to the bottom wall 100 of the lower case 22 that is located on the upper side. Specifically, the fuse connecting portion 84 of the first heat-dissipating bus bar 18a and the relay connecting portions 88 of the second to fifth heat-dissipating bus bars 18b to 18e are inserted into the case 24 through the first to fifth insertion holes 111a to 111e provided in the bottom wall 100 of the lower case 22. Here, the first to fifth heat-dissipating portions 26a to 26e of the first to fifth heat-dissipating bus bars 18a to 18e are accommodated into the first to fifth recessed portions 108a to 108e provided in the bottom wall 100 of the lower case 22. That is, the first to fifth heat-dissipating portions 26a to 26e are brought into contact with the first to fifth positioning portions 110a to 110e to position the first to fifth heat-dissipating bus bars 18a to 18e relative to the lower case 22. Thus, the placement surface 107 becomes flush with the lower faces of the first to fifth heat-dissipating portions 26a to 26e (in reality, the upper faces thereof since the first to fifth heat-dissipating portions 26a to 26e are vertically inverted during assembly). Here, of the positioning portions 110 (the first to fifth positioning portions 110a to 110e), the first positioning portion 110a for positioning the first heat-dissipating bus bar 18a (the second heat-generating component metal plate) corresponds to the second metal plate positioning portion. Of the positioning portions 110 (the first to fifth positioning portions 110a to 110e), the second to fifth positioning portions 110b to 110e for positioning the second to fifth heat-dissipating bus bars 18b to 18e (the first heat-generating component metal plates) each correspond to the first metal plate positioning portion.

The fuse connecting portion 84 and the relay connecting portions 88 are inserted into the case 24, and thus, the fuse connecting portion 54 of the first current-carrying bus bar 16a is stacked, in the up-down direction, with the fuse connecting portion 84 of the first heat-dissipating bus bar 18a. Thus, the left bolt insertion hole 40 in the fuse 12 and the bolt insertion holes 58 and 86 in the fuse connecting portions 54 and 84 are positioned relative to each other. Further, the relay connecting portions 64, 68, and 76 of the second to fourth current-carrying bus bars 16b to 16d are stacked, in the front-back direction, with the relay connecting portions 88 of the second to fifth heat-dissipating bus bars 18b to 18e. Thus, the first to fourth connecting portions 44a to 44d of the first and second relays 14a and 14b, the bolt insertion holes 66, 70, and 78 in the relay connecting portions 64, 68, and 76, and the bolt insertion holes 90 in the relay connecting portions 88 are positioned relative to each other.

Thereafter, the second bolt 130 that extends in the up-down direction (i.e. the direction in which the upper case 20 and the lower case 22 are fitted to each other) and a fastening tool (not shown) are inserted into the first insertion hole 111a. Then, the second bolt 130 is inserted into the bolt insertion holes 40, 58, and 86 that have been positioned relative to each other, and is fastened to the nut 99. Thus, the fuse 12 is fixed to the upper case 20, and the first current-carrying bus bar 16a and the first heat-dissipating bus bar 18a are fastened together to the connecting portion 38 of the fuse 12 by means of bolting. Also, the first bolts 132 that extend in the front-back direction (a direction orthogonal to the direction in which the upper case 20 and the lower case 22 are fitted to each other) and a fastening tool (not shown) are inserted into the work holes 120 provided in the front part of the case 24. Then, the first bolts 132 are inserted into the first to fourth connecting portions 44a to 44d and the bolt insertion holes 66, 70, 78, and 90 that have been positioned relative to each other, and are fastened to the first to fourth connecting portions 44a to 44d. Thus, the second to fourth current-carrying bus bars 16b to 16d and the second to fifth heat-dissipating bus bars 18b to 18e are fastened together to the first to fourth connecting portions 44a to 44d of the first and second relays 14a and 14b by means of bolting. The first to fourth current-carrying bus bars 16a to 16d and the first to fifth heat-dissipating bus bars 18a to 18e are connected to the connecting portions 38 of the fuse 12 and the connecting portions 44a to 44d of the first and second relays 14a and 14b.

After fastening the first bolts 132, the caps 122 are fitted to the work holes 120 to close the work holes 120, which are openings in the case 24. After fastening the second bolt 130 through the first insertion hole 111a, the lid portion 128 is fitted to the lid accommodating portion 112 to close the first insertion hole 111a. Note that the lid portion 128 does not detach from the lid accommodating portion 112 even when the lid portion 128 is simply placed on the bottom section 114 of the lid accommodating portion 112 since the case 24 is vertically inverted, but for example, a protrusion for preventing the lid portion 128 from detaching may also be provided at an opening edge of the lid accommodating portion 112. The lid portion 128 can be fitted to the opening edge of the lid accommodating portion 112 by moving the lid portion 128 over this protrusion.

Next, the first opening portion 28a is sealed by sticking the first insulating film 30a to the bottom wall 100 of the lower case 22 so as to cover the first heat-dissipating portion 26a and the lid portion 128. Also, the second to fifth opening portions 28b to 28e are sealed by sticking the second insulating film 30b so as to cover the second to fifth heat-dissipating portions 26b to 26e. Next, the filler 32 is provided on the bottom wall 100 of the lower case 22 and the first and second insulating films 30a and 30b. Thereafter, the entire body is vertically inverted, and the circuit assembly 10 of Embodiment 1 is complete.

In Embodiment 1, the filler 32 before assembly is in a grease form, and is cured while being pressed against the upper face of the metal housing 29 after being applied to the lower faces of the bottom wall 100 of the lower case 22 and the first and second insulating films 30a and 30b. Thus, the first to fifth heat-dissipating portions 26a to 26e come into thermal contact with the housing 29 via the first and second insulating films 30a and 30b and the filler 32. Applying the filler 32 in a grease form to the case 24 and curing the filler 32 pressed against the housing 29 prevents air from entering between the lower case 22, the first and second insulating films 30a and 30b, and the filler 32, and between the filler 32 and the housing 29. For this reason, in Embodiment 1, the lower face of the lower case 22 is located slightly below the upper face of the filler 32 with the circuit assembly 10 fixed to the housing 29 (see FIG. 4 and other figures).

In the circuit assembly 10 assembled through the above process, the external connecting portions 52, 72, and 80 of the first, third, and fourth current-carrying bus bars 16a, 16c, and 16d are exposed to the outside through the open windows 96 of the case 24 (upper case 20). Terminals provided at the ends of external wires are placed over the external connecting portions 52, 72, and 80, and bolts (not shown) are inserted into the bolt insertion holes 56, 74, and 82 in the external connecting portions 52, 72, and 80 and fastened to the nuts 106. The external wires are thus electrically connected to the circuit assembly 10.

The fuse 12 and the first and second relays 14a and 14b generate heat as a result of a current flowing through the fuse 12 and first and second relays 14a and 14b. Heat generated by the fuse 12 and the first and second relays 14a and 14b is transferred to the first to fifth heat-dissipating portions 26a to 26e of the first to fifth heat-dissipating bus bars 18a to 18e. This heat is dissipated to the outside through the housing 29 that comes into thermal contact with the first to fifth heat-dissipating portions 26a to 26e via the first and second insulating films 30a and 30b and the filler 32.

Accordingly, in the circuit assembly 10 of Embodiment 1, the first to fifth heat-dissipating portions 26a to 26e can come into thermal contact with the housing 29 via the first and second insulating films 30a and 30b and the filler 32, without via a synthetic resin case as in conventional structures. Electrical insulation between the first to fifth heat-dissipating portions 26a to 26e and the housing 29 can thus be achieved by the first and second insulating films 30a and 30b. Further, the number of components on heat-dissipating paths from the first to fifth heat-dissipating portions 26a to 26e to the housing 29 can be reduced, and the length of each heat-dissipating path can be shortened, thereby increasing the heat-dissipating efficiency. Further, the filler 32 absorbs unevenness formed due to the lower face of the lower case 22 and the first and second insulating films 30a and 30b. This prevents air from entering between the lower case 22, the first and second insulating films 30a and 30b, and the housing 29. As a result, the heat-dissipating efficiency can be further increased.

Particularly, in Embodiment 1, the first and second insulating films 30a and 30b are separate from the filler 32, making it possible to employ the first and second insulating films 30a and 30b with excellent insulating efficiency and the filler 32 with excellent heat transfer efficiency. This can increase both the insulating efficiency and the heat transfer efficiency. Further, the first and second insulating films 30a and 30b have respective sizes that are larger than the first heat-dissipating portion 26a and the second to fifth heat-dissipating portions 26b to 26e, respectively, in a plan view. This realizes excellent electrical insulation between the first to fifth heat-dissipating portions 26a to 26e and the housing 29.

The disposal regions of the first and second insulating films 30a and 30b overlaps the disposal region of the filler 32, and thus, the size and shape of the first and second insulating films 30a and 30b and the filler 32 can be set in accordance with the required electrical insulation and thermal conductivity. This enables the effect of increasing the design flexibility and reducing the material cost, for example.

The case 24 having the first to fifth opening portions 28a to 28e that expose the first to fifth heat-dissipating portions 26a to 26e to the outside can reduce the amount of resin necessary for the case 24. The first to fifth opening portions 28a to 28e are sealed by providing the first and second insulating films 30a and 30b over a region wider than the first to fifth opening portions 28a to 28e in a plan view. This prevents water from entering the case 24 through the first to fifth opening portions 28a to 28e and improves waterproofness. Particularly, water is further prevented from entering the case 24 through the first to fifth opening portions 28a to 28e by providing the filler 32 over a region wider than the lower face (placement surface 107) of the lower case 22 and a region that is at least wider than the first to fifth opening portions 28a to 28e, for example. This further improves waterproofness.

The plurality of protrusions 116 are provided around the first and second insulating films 30a and 30b stuck to the lower face of the lower case 22. This mitigates the concern that the user unintentionally touches the first and second insulating films 30a and 30b and peels the first and second insulating films 30a and 30b. Further, the first and second insulating films 30a and 30b are stuck inward of the plurality of protrusions 116, which can therefore serve as marks when the first and second insulating films 30a and 30b are stuck. Further, the gaps 118 are provided between the plurality of protrusions 116. Thus, even if the filler 32 is provided on the lower faces of the lower case 22 and the first and second insulating films 30a and 30b, air between the lower case 22, the first and second insulating films 30a and 30b, and the filler 32 is discharged from the gaps 118 to the outside. This prevents air from entering between the lower case 22, the first and second insulating films 30a and 30b, and the filler 32. As a result, heat generated by the heat-generating components (the fuse 12 and the first and second relays 14a and 14b) can be stably dissipated.

Particularly, the plurality of protrusions 116, each of which has a triangular shape, are arranged so as to be gradually tapered inward. Thus, a large opening dimension on the inner side can be ensured in the gaps 118 between the protrusions 116. Air pushed out by the first and second insulating films 30a and 30b and the filler 32 can thus be efficiently caught and discharged. Further, the opening dimension on the outer side of the gaps 118 between the protrusions 116 can be kept small. This may further mitigate the concern that the user will unintentionally touch the first and second insulating films 30a and 30b.

The lower case 22 has the first to fifth positioning portions 110a to 110e for positioning the first to fifth heat-dissipating bus bars 18a to 18e. The lower face (placement surface 107) of the lower case 22 is flush with the lower faces of the first to fifth heat-dissipating portions 26a to 26e with the first to fifth heat-dissipating bus bars 18a to 18e positioned by the first to fifth positioning portions 110a to 110e. This can suppress or prevent deterioration of workability in sticking the first and second insulating films 30a and 30b due to a step occurring between the placement surface 107 and the lower faces of the first to fifth heat-dissipating portions 26a and 26e when the first and second insulating films 30a and 30b are stuck to seal the first to fifth opening portions 28a to 28e. Furthermore, it can also be advantageously suppressed or prevented that such a step makes it unable to flatly fix the first and second insulating films 30a and 30b to the lower case 22, resulting in air being caught between the first and second insulating films 30a and 30b and the filler 32 and deteriorating the heat dissipation.

Particularly, in Embodiment 1, the fuse connecting portion 84 and the relay connecting portions 88 of the first to fifth heat-dissipating bus bars 18a to 18e are inserted into the first to fifth insertion holes 111a to 111e provided in the lower case 22. Then, the fuse connecting portion 84 and the relay connecting portions 88 are positioned relative to the connecting portion 38 of the fuse 12 and the first to fourth connecting portions 44a to 44d of the first to second relays 14a and 14b. Here, the first and second tolerance absorbing structures that absorb the tolerances at these connecting positions are provided. This enables stable connection between the connecting portion 38 and the first to fourth connecting portions 44a to 44d of the fuse 12 and the first and second relays 14a and 14b and the fuse connecting portion 84 and the relay connecting portions 88 of the first to fifth heat-dissipating bus bars 18a to 18e by means of bolting.

In Embodiment 1, the aforementioned first and second tolerance absorbing structures are structures that enables the bolt insertion holes 90 each having a hole shape elongated in the up-down direction and the nuts 99 to be displaced in the up-down direction, thus making it possible to realize simple tolerance absorbing structures.

In Embodiment 1, the work holes 120 that extend through the case 24 in the thickness direction are provided. The first to fourth connecting portions 44a to 44d of the first and second relays 14a and 14b, the relay connecting portions 64, 68, and 76 of the second to fourth current-carrying bus bars 16b to 16d, and the relay connecting portions 88 of the second to fifth heat-dissipating bus bars 18b to 18e can be bolted to each other through these work holes 120. This eliminates the need to separately fix the second to fourth current-carrying bus bars 16b and 16d and the second to fifth heat-dissipating bus bars 18b to 18e to the first and second relays 14a and 14b, and improves workability. Particularly, the relay connecting portions 88 of the second to fifth heat-dissipating bus bars 18b to 18e having the bolt insertion holes 90 that constitute the first tolerance absorbing structure further improve workability.

The first to fifth positioning portions 110a to 110e for positioning the first to fifth heat-dissipating bus bars 18a to 18e relative to the case 24 (lower case 22) are constituted by the top plates of the first to fifth recessed portions 108a to 108e for accommodating the first to fifth heat-dissipating portions 26a to 26e of the first to fifth heat-dissipating bus bars 18a to 18e. That is, a simple configuration in which the first to fifth recessed portions 108a to 108e are provided in the lower face of the lower case 22 to accommodate the first to fifth heat-dissipating portions 26a to 26e can realize both the effect of making the placement surface 107 of the lower case 22 flush with the lower faces of the first to fifth heat-dissipating portions 26a to 26e and the effect of positioning the first to fifth heat-dissipating bus bars 18a to 18e.

The lid portion 128 closes the first insertion hole 111a into which the second 130 and a fastening tool are inserted when the connecting section (fuse connecting portion 84) of the first heat-dissipating bus bar 18a is bolted with the connecting portion 38 of the fuse 12. This prevents water from entering through the first insertion hole 111a, and prevents the user from unintentionally touching the first heat-dissipating bus bar 18a. In addition, for example, this prevents the user's finger or the like from entering the case 24 through the first insertion hole 111a after the first insulating film 30a is stuck and breaking the first insulating film 30a. Particularly, in Embodiment 1, the lower faces of the lower case 22, the first to fifth heat-dissipating portions 26a to 26e, and the lid portion 128 being flush with each other advantageously suppresses or prevents the occurrence of a step. This enables work to stick the first and second insulating films 30a and 30b to be smoothly performed, and flattening the surfaces of the first and second insulating films 30a and 30b that come into contact with the filler 32 advantageously suppresses or prevents air from entering between the first and second insulating films 30a and and the filler 32 to deteriorate heat dissipation.

Other Embodiments

The technology described herein is not limited to the embodiment described above and illustrated in the drawings. For example, the following embodiments are also included in the technical scope of the technology described in the present specification.

(1) In the above embodiment, three heat-generating components (the fuse 12 and the first and second relays 14a and 14b) are provided. However, the number of heat-generating components need only be at least one.

(2) In the above embodiment, the current-carrying bus bars 16 (the first to fourth current-carrying bus bars 16a to 16d) are separate from the heat-dissipating bus bars (the first to fifth heat-dissipating bus bars 18a to 18e). However, the current-carrying bus bars and the heat-dissipating bus bars may be integrated. That is, a heat-dissipating portions may be provided to a current-carrying and heat-dissipating metal plate, and this heat-dissipating portion may come into thermal contact with a heat-dissipation target via an insulating film and a thermal conductive filling member.

(3) The structure of the case for accommodating the heat-generating components and the metal plates is not limited to the mode described in the above embodiment. For example, the opening portion of the upper case may be made larger than the opening portion of the lower case, and the side walls of the upper case may be located inward of the peripheral walls of the lower case. If there is a concern that water may enter from between the upper case and the lower case, a known conventional waterproof structure may be provided between the upper case and the lower case.

Figure 9:
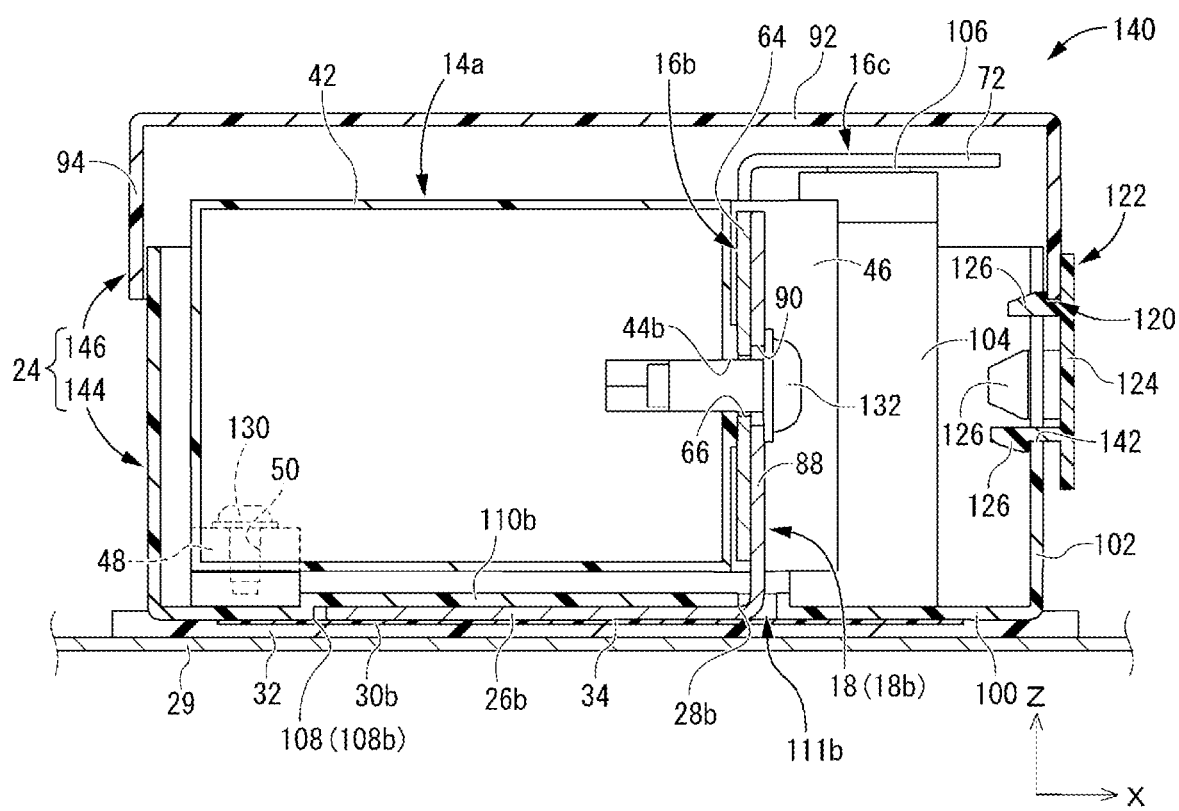
FIG. 9 is a vertical cross-sectional view of a circuit assembly in another mode, and corresponds to FIG. 4.

(4) In the above embodiment, the upper case 20 has the open windows 98 that constitute the work holes 120 on the front side of the case 24. However, an open window 142 that is open upward may alternatively be provided in a peripheral wall 102 of a lower case 144 as in a circuit assembly 140 shown in FIG. 9. A work hole 120 may be formed by closing an upward opening portion of the open window 142 with a side wall 94 of an upper case 146. Note that in the above embodiment and the mode shown in FIG. 9, the work hole 120 is formed by closing the downward opening portion of the open window 98 that is open downward or the upward opening portion of the open window 142 that is open upward by the peripheral wall 102 of the lower case 22 or the side wall 94 of the upper case 146. However, these modes need not be the case. A work hole that extends through the side wall of the upper case or the peripheral wall of the lower case in the thickness direction may directly be formed, or open windows may be provided in both the side wall of the upper case and the peripheral wall of the lower case such that a work hole is formed by overlapping these open windows with each other in the front-back direction. In the mode shown in FIG. 9, the attachment portion 48 is provided at a lower portion of the relay body 42 of the first relay 14a, and the first relay 14a is fixed to the lower case 144 by the second bolt 130 inserted into the bolt insertion hole 50 in the attachment portion 48. Thus, the heat-generating components and the metal plates accommodated in the case may be fitted to the lower case.

(5) The above embodiment has described a structure in which the lower case 22 has the placement surface 107, which has the opening portions 28 (the first to fifth opening portions 28a to 28e), but the present disclosure is not limited thereto. For example, the circuit assembly need not have the lower case, and may alternatively have a case having a structure in which the side wall of the upper case includes a fixing portion to be fixed to a heat-dissipation target and is fixed to the heat-dissipation target via this fixing portion. In this case, an insulating film that is larger, over the entire periphery, than the heat-dissipating portion is fixed to the lower face of the heat-dissipating portion, and a thermal conductive filling member is disposed between the insulating film and the housing. This can not only ensure electrical insulation between the heat-dissipating portion and the housing, but also enable excellent heat conductivity and similarly achieve the operation and effect of the present disclosure. Particularly, water is also prevented from entering the case by fixing the insulating film to an end face of the side wall of the upper case and sealing the opening portion of the case.

(6) In the above embodiment, the work holes 120 are closed by the caps 122. If, for example, the work holes are provided at positions higher than the height of water expected to occur on the housing due to condensation or the like, the caps for closing the work holes need not be provided. In the above embodiment, four work holes 120 are provided, and two caps 122 are provided such that each cap 122 closes two adjacent work holes 120. Alternatively, four caps may be provided so as to separately close the respective work holes, or one cap that closes the four work holes may be provided.

(7) In the above embodiment, a plurality of triangular protrusions 116 are provided around the first and second insulating films 30*a* and 30*b* on the lower face (placement surface 107) of the lower case 22, but this mode need not be the case. Each protrusion may alternatively have a polygonal shape, such as a rectangular shape, or may have a circular shape (including a perfect circle, an ellipse, an elongated circle, a semicircle etc.). In the case of a triangular shape, each protrusion need not be tapered inward from the outer side as in the above embodiment, and may alternatively be tapered outward from the inner side. Alternatively, for example, the protrusions may be provided in a region that covers one-third or a half of the periphery of each insulating film. Alternatively, the protrusions may be provided over the substantially entire periphery, and notch-shaped gaps may be provided at portions of the periphery. This allows air between the lower case, the insulating films, and the filler to escape through the gaps when the insulating film is stuck. However, the gaps between the protrusions are not essential, and the protrusions may be continuously provided over the entire periphery of each insulating film. In this case, the effect of preventing peeling of the insulating film can be achieved more stably. Note that, in the present disclosure, the protrusions provided on the lower face of the lower case are not essential.

(8) The above embodiment has illustrated the filler 32 that is in a grease form when applied and in a sheet form after cured. However, the filler 32 is not limited thereto, and may alternatively be a known conventional thermal conductive sheet or the like, for example. In the above embodiment, the filler 32 is provided in an area larger than the lower face of the lower case 22, but the disposal region is not limited. The filler may alternatively be provided in an area narrower than the lower face of the lower case, or may be provided in a disposal region smaller than the insulating films in a plan view.

(9) In the above embodiment, the first insulating film 30*a* and the second insulating film 30*b* are larger than the first opening portion 28*a* and the second to fifth opening portions 28*b* to 28*e*, respectively, in a plan view, and the first to fifth opening portions 28*a* to 28*e* are sealed by the first and second insulating films 30*a* and 30*b*. However, each insulating film may alternatively have a size smaller than the corresponding opening portion(s) of the case in a plan view. In this case, a waterproof mechanism for preventing water from entering the case may also be separated employed.

(10) In the above embodiment, the second insulating film 30*b* is one sheet of film having a size that entirely covers the second to fifth opening portions 28*b* to 28*e*. However, the second to fifth opening portions may alternatively be sealed by separate insulating films, for example. The above embodiment provides two insulating films, namely the first insulating film 30*a* that seals the first opening portion 28*a*, and the second insulating film 30*b* that seals the second to fifth opening portions 28*b* to 28*e*. Alternatively, one sheet of insulating film that entirely covers the first to fifth opening portions may be provided. Note that in the above embodiment, the first and second insulating films 30*a* and 30*b* each have a rectangular shape, but the shape of each insulating film is not limited.

LIST OF REFERENCE NUMERALS

10 Circuit assembly
12 Fuse (heat-generating component, second heat-generating component)
14 Relay (heat-generating component, first heat-generating component)
14*a* First relay
14*b* Second relay
16 Current-carrying bus bar
16*a* First current-carrying bus bar
16*b* Second current-carrying bus bar
16*c* Third current-carrying bus bar
16*d* Fourth current-carrying bus bar
18 Heat-dissipating bus bar (metal plate)
18*a* First heat-dissipating bus bar (second heat-generating component metal plate)
18*b* Second heat-dissipating bus bar (first heat-generating component metal plate)
18*c* Third heat-dissipating bus bar (first heat-generating component metal plate)
18*d* Fourth heat-dissipating bus bar (first heat-generating component metal plate)
18*e* Fifth heat-dissipating bus bar (first heat-generating component metal plate)
20 Upper case
22 Lower case
24 Case
26 Heat-dissipating portion
26*a* First heat-dissipating portion
26*b* Second heat-dissipating portion
26*c* Third heat-dissipating portion
26*d* Fourth heat-dissipating portion
26*e* Fifth heat-dissipating portion
28 Opening portion
28*a* First opening portion
28*b* Second opening portion
28*c* Third opening portion
28*d* Four opening portion
28*e* Fifth opening portion
29 Housing (heat-dissipation target)
30 Insulating film
30 a First insulating film
30*b* Second insulating film
32 Filler (thermal conductive filling member)
34 Contact surface
36 Fuse body
38 Connecting portion
40 Bolt insertion hole
42 Relay body 44 Connecting portion
44a First connecting portion
44b Second connecting portion
44c Third connecting portion
44d Fourth connecting portion
46 Partition plate
48 Attachment portion
50 Bolt insertion hole
52 External connecting portion
54 Fuse connecting portion
56, 58 Bolt insertion hole
60 Fuse connecting portion
62 Bolt insertion hole
64 Relay connecting portion
66 Bolt insertion hole
68 Relay connecting portion
70 Bolt insertion hole
72 External connecting portion
74 Bolt insertion hole
76 Relay connecting portion
78 Bolt insertion hole
80 External connecting portion
82 Bolt insertion hole
84 Fuse connecting portion (connecting section)
84a First region
86 Bolt insertion hole
87 Joint portion
87a Second region
88 Relay connecting portion (connecting section)
90 Bolt insertion hole (first tolerance absorbing structure)
92 Top wall
94 Side wall
96, 98 Open window
99 Nut
100 Bottom wall
102 Peripheral wall
104 Support portion
106 Nut
107 Placement surface
108 Recessed portion
108a First recessed portion
108b Second recessed portion
108c Third recessed portion
108d Four recessed portion
108e Fifth recessed portion
110 Positioning portion
110a First positioning portion (second metal plate positioning portion)
110b Second positioning portion (first metal plate positioning portion)
110c Third positioning portion (first metal plate positioning portion)
110d Fourth positioning portion (first metal plate positioning portion)
110e Fifth positioning portion (first metal plate positioning portion)
111 Insertion hole
111a First insertion hole
111b Second insertion hole
111c Third insertion hole
111d Fourth insertion hole
111e Fifth insertion hole
112 Lid accommodating portion
114 Bottom section
116 Protrusion
118 Gap
120 Work hole
122 Cap
124 Base plate portion
126 Claw portion
128 Lid portion
130 Second bolt
132 First bolt
140 Circuit assembly
142 Open window
144 Lower case
146 Upper case
S Gap

The invention claimed is:

1. A circuit assembly comprising:
at least one heat-generating component that generates heat as a result of a current flowing therethrough;
a case accommodating the at least one heat-generating component;
at least one metal plate connected to a connecting portion of the at least one heat-generating component, and having a heat-dissipating portion exposed to an outside of the case and configured to come into thermal contact with an external heat-dissipation target;
an insulating film covering a contact surface of the heat-dissipating portion, the contact surface being configured to come into contact with the heat-dissipation target; and
a thermal conductive filling member that is in thermal contact with the heat-dissipating portion via the insulating film and disposed between the insulating film and the heat-dissipation target.

2. The circuit assembly according to claim 1, wherein a disposal region of the insulating film and a disposal region of the thermal conductive filling member are different.

3. The circuit assembly according to claim 1, wherein the case has an opening portion that exposes the heat-dissipating portion to the outside, and the insulating film seals the opening portion.

4. The circuit assembly according to claim 1, wherein the insulating film is fixed to the case, and the case has a plurality of protrusions disposed with gaps therebetween around a peripheral edge of the insulating film.

5. A circuit assembly comprising:
at least one heat-generating component that generates heat as a result of a current flowing therethrough;
a case accommodating the at least one heat-generating component;
at least one metal plate connected to a connecting portion of the at least one heat-generating component, and having a heat-dissipating portion exposed to an outside of the case and configured to come into thermal contact with an external heat-dissipation target;
an insulating film covering a contact surface of the heat-dissipating portion, the contact surface being configured to come into contact with the heat-dissipation target; and
a thermal conductive filling member that is in thermal contact with the heat-dissipating portion via the insulating film and disposed between the insulating film and the heat-dissipation target,
wherein the insulating film is fixed to the case, and the case has a plurality of protrusions disposed with gaps therebetween around a peripheral edge of the insulating film,
wherein the case includes an upper case and a lower case, and the plurality of protrusions each have a triangular shape in a projection in a direction in which the upper case and the lower case are fitted to each other, and are gradually tapered toward the insulating film located inward of the protrusions.

6. A circuit assembly comprising:
at least one heat-generating component that generates heat as a result of a current flowing therethrough;
a case accommodating the at least one heat-generating component;
at least one metal plate connected to a connecting portion of the at least one heat-generating component, and having a heat-dissipating portion exposed to an outside of the case and configured to come into thermal contact with an external heat-dissipation target;
an insulating film covering a contact surface of the heat-dissipating portion, the contact surface being configured to come into contact with the heat-dissipation target; and
a thermal conductive filling member that is in thermal contact with the heat-dissipating portion via the insulating film and disposed between the insulating film and the heat-dissipation target,
wherein the case includes an upper case and a lower case,
the at least one heat-generating component is fixed to at least either the upper case or the lower case, the lower case has a placement surface to be placed on the heat-dissipation target, and the placement surface has an opening portion,
the lower case has at least one positioning portion positioning the heat-dissipating portion of the at least one metal plate disposed in the opening portion such that the heat-dissipating portion is flush with the placement surface,
the at least one metal plate has a connecting section connected to the connecting portion of the at least one heat-generating component, and
the circuit assembly has at least one tolerance absorbing structure absorbing tolerances of the connecting section and the connecting portion at a connecting position when the heat-dissipating portion is positioned by the at least one positioning portion.

7. The circuit assembly according to claim 6,
wherein the at least one heat-generating component includes a first heat-generating component,
the at least one metal plate includes a first heat-generating component metal plate connected to the connecting portion of the first heat-generating component, and
the connecting portion of the first heat-generating component and the connecting section of the first heat-generating component metal plate are fastened to each other using a first bolt extending in a direction orthogonal to a direction in which the upper case and the lower case are fitted to each other, a fastened section of the first heat-generating component metal plate has a bolt insertion hole having an elongated hole shape extending in the direction in which the upper case and the lower case are fitted to each other, and the bolt insertion hole constitutes a first tolerance absorbing structure that is included in the at least one tolerance absorbing structure.

8. The circuit assembly according to claim 7,
wherein the upper case has a top wall and a side wall protruding from the top wall toward the lower case, the lower case has a bottom wall and a peripheral wall protruding from the bottom wall toward the upper case, and at least either the side wall or the peripheral wall has a work hole that allows the first bolt and a tool for fastening the first bolt to be inserted thereinto.

9. The circuit assembly according to claim 7,
wherein the first heat-generating component metal plate is bent in an L shape, one end portion of the first heat-generating component metal plate serves as the heat-dissipating portion expanding parallel to the placement surface of the lower case, and another end portion of the first heat-generating component metal plate serves as the connecting section raised toward the upper case, and
the placement surface of the lower case has an insertion hole having a slit shape that allows the connecting section to be inserted thereinto, and a recessed portion connected to the insertion hole, recessed toward the upper case, and accommodating the heat-dissipating portion, the opening portion includes the insertion hole and the recessed portion, a top plate of the recessed portion constitutes a first metal plate positioning portion positioning the first heat-generating component metal plate, and the first metal plate positioning portion is included in the at least one positioning portion.

10. The circuit assembly according to claim 6,
wherein the at least one heat-generating component includes a second heat-generating component,
the at least one metal plate includes a second heat-generating component metal plate connected to the connecting portion of the second heat-generating component,
the second heat-generating component metal plate has the heat-dissipating portion provided on one end side and expanding parallel to the placement surface of the lower case, the connecting section provided on another end side, located on the upper case side relative to the heat-dissipating portion, and expanding parallel to the heat-dissipating portion, and a joint portion raised from the heat-dissipating portion toward the connecting section,
the placement surface of the lower case has an insertion hole that allows the connecting section and the joint portion to be inserted thereinto, and a recessed portion connected to the insertion hole, recessed toward the upper case, and accommodating the heat-dissipating portion, the opening portion includes the insertion hole and the recessed portion, a top plate of the recessed portion constitutes a second metal plate positioning portion positioning the second heat-generating component metal plate, and the second metal plate positioning portion is included in the at least one positioning portion, and
the connecting section is fastened to the connecting portion of the second heat-generating component by a second bolt, and a nut to which the second bolt accommodated in the upper case is fastened is held so as to be displaceable in a direction away from the placement surface of the lower case, thereby constituting a second tolerance absorbing structure, which is included in the at least one tolerance absorbing structure.

11. The circuit assembly according to claim 10,
wherein the insertion hole includes a first region into which the connecting section is allowed to be inserted, and a second region into which the joint portion is allowed to be inserted, and a lid portion covering the first region of the insertion hole is removably fixed to the placement surface.

* * * * *